(12) United States Patent
Kim et al.

(10) Patent No.: US 11,152,374 B2
(45) Date of Patent: Oct. 19, 2021

(54) SEMICONDUCTOR DEVICE HAVING BIT LINE STRUCTURE WITH SPACER STRUCTURE AND METHOD OF MANUFACTURING THE SAME

(71) Applicant: SAMSUNG ELECTRONICS CO., LTD., Suwon-si (KR)

(72) Inventors: Jin-A Kim, Hwaseong-si (KR); Yong-Kwan Kim, Yongin-si (KR); Se-Keun Park, Suwon-si (KR); Jung-Woo Song, Hwaseong-si (KR); Joo-Young Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/171,517

(22) Filed: Oct. 26, 2018

(65) Prior Publication Data
US 2019/0206873 A1 Jul. 4, 2019

(30) Foreign Application Priority Data
Jan. 2, 2018 (KR) .................. 10-2018-0000355

(51) Int. Cl.
*H01L 27/108* (2006.01)
*H01L 21/768* (2006.01)

(52) U.S. Cl.
CPC .... *H01L 27/10885* (2013.01); *H01L 21/7682* (2013.01); *H01L 27/10814* (2013.01); *H01L 27/10823* (2013.01); *H01L 27/10855* (2013.01); *H01L 27/10888* (2013.01)

(58) Field of Classification Search
CPC ... H01L 21/7682; H01L 27/108–10897; H01L 27/10814; H01L 27/10823; H01L 27/10855; H01L 27/10885; H01L 27/10888
See application file for complete search history.

(56) References Cited

U.S. PATENT DOCUMENTS

| 9,472,644 | B2 | 10/2016 | Sung |
| 9,515,022 | B2 | 12/2016 | Kwon et al. |
| 9,824,726 | B2 | 11/2017 | Han et al. |
| 9,847,278 | B2 | 12/2017 | Kim et al. |
| 2016/0211215 | A1* | 7/2016 | Lee .................. H01L 29/4236 |
| 2017/0076974 | A1 | 3/2017 | Choi et al. |

FOREIGN PATENT DOCUMENTS

| KR | 10-2013-0123687 A | 11/2013 |
| KR | 10-2015-0095044 A | 8/2015 |
| KR | 10-2015-0108194 A | 9/2015 |
| KR | 10-2016-0074306 A | 6/2016 |
| KR | 10-2017-0025859 A | 3/2017 |

* cited by examiner

*Primary Examiner* — Suberr L Chi
(74) *Attorney, Agent, or Firm* — Lee IP Law, P.C.

(57) ABSTRACT

A semiconductor device includes a bit line structure on a substrate, a spacer structure including a first spacer directly contacting a sidewall of the bit line structure, a second spacer directly contacting a portion of an outer sidewall of the first spacer, the second spacer including air, and a third spacer directly contacting an upper portion of the first spacer and covering an outer sidewall and an upper surface of the second spacer, and a contact plug structure extending in a vertical direction substantially perpendicular to an upper surface of the substrate and directly contacting an outer sidewall of the third spacer at least at a height between respective heights of a bottom and a top surface of the second spacer.

17 Claims, 27 Drawing Sheets

SEMICONDUCTOR DEVICE HAVING BIT LINE STRUCTURE WITH SPACER STRUCTURE AND METHOD OF MANUFACTURING THE SAME

CROSS-REFERENCE TO RELATED APPLICATION

Korean Patent Application No. 10-2018-0000355, filed on Jan. 2, 2018, in the Korean Intellectual Property Office (KIPO), and entitled: "Semiconductor Device and Method of Manufacturing the Same," is incorporated by reference herein in its entirety.

BACKGROUND

1. Field

Example embodiments relate to a semiconductor device and a method of manufacturing the same. More particularly, example embodiments relate to a dynamic random access memory (DRAM) device and a method of manufacturing the same.

2. Description of the Related Art

When a DRAM device is manufactured, a parasitic capacitance may be generated between a bit line and a capacitor contact plug. In order to reduce the parasitic capacitance, a method of forming an air gap between the bit line and the capacitor contact plug is needed.

SUMMARY

According to example embodiments, there is provided a semiconductor device, including a bit line structure on a substrate, a spacer structure including a first spacer directly contacting a sidewall of the bit line structure, a second spacer directly contacting a portion of an outer sidewall of the first spacer, the second spacer including air, and a third spacer directly contacting an upper portion of the first spacer and covering an outer sidewall and an upper surface of the second spacer, and a contact plug structure extending in a vertical direction substantially perpendicular to an upper surface of the substrate and directly contacting an outer sidewall of the third spacer at least at a height between respective heights of a bottom and a top surface of the second spacer.

According to example embodiments, there is provided a semiconductor device. The semiconductor device may include a bit line structure on a substrate, a spacer structure, a capping pattern, and a contact plug structure adjacent the capping pattern. The bit line structure may extend in a first direction substantially parallel to an upper surface of the substrate. The spacer structure may include first, second and third spacers sequentially stacked on each of opposite sidewalls of the bit line structure in a second direction substantially parallel to the upper surface of the substrate and substantially perpendicular to the first direction. The first, second and third spacers may include a nitride, air, and a nitride, respectively. The capping pattern may extend on the substrate in the second direction, and cover the bit line structure and the spacer structure. The contact plug structure may extend in a vertical direction substantially perpendicular to an upper surface of the substrate, and contact an outer sidewall of the spacer structure and a portion of an upper surface of the bit line structure. The second spacer may include a first portion overlapping the contact plug structure in the vertical direction and a second portion overlapping the capping pattern in the vertical direction, and upper surfaces of the first and second portions of the second spacer may be substantially coplanar with each other.

According to example embodiments, there is provided a semiconductor device. The semiconductor device may include a bit line structure on a substrate, a spacer structure, a first capping pattern, and a contact plug structure adjacent the capping pattern. The bit line structure may extend in a first direction substantially parallel to an upper surface of the substrate. The spacer structure may include first, second and third spacers sequentially stacked on each of opposite sidewalls of the bit line structure in a second direction substantially parallel to the upper surface of the substrate and substantially perpendicular to the first direction. The first, second and third spacers may include a nitride, air, and a nitride, respectively. The first capping pattern may extend on the substrate in the second direction, and cover the bit line structure and the spacer structure. The contact plug structure may extend in a vertical direction substantially perpendicular to an upper surface of the substrate, and contact an outer sidewall of the spacer structure. A top surface of a portion of the bit line structure covered by the first capping pattern may have a height lower than a height of a top surface of a portion of the bit line structure not covered by the first capping pattern.

BRIEF DESCRIPTION OF THE DRAWINGS

Features will become apparent to those of skill in the art by describing in detail exemplary embodiments with reference to the attached drawings, in which:

FIGS. 2, 4, 6-9, 11-16, 18, 20-22, 24-25, and 27 illustrate cross-sectional views of stages in a method of manufacturing the semiconductor device in accordance with example embodiments.

DETAILED DESCRIPTION

Example embodiments will be more clearly understood from the following detailed description taken in conjunction with the accompanying drawings.

FIGS. 1, 3, 5, 7, 10, 17, 19, 23, and 26 are plan views illustrating a method of manufacturing a semiconductor device in accordance with example embodiments, and FIGS. 2, 4, 6-9, 11-16, 18, 20-22, 24-25, and 27 are cross-sectional views illustrating the method of manufacturing the semiconductor device in accordance with example embodiments. The cross-sectional views include cross-sections taken along lines A-A' and B-B' of corresponding plan views, respectively.

Figure 1:
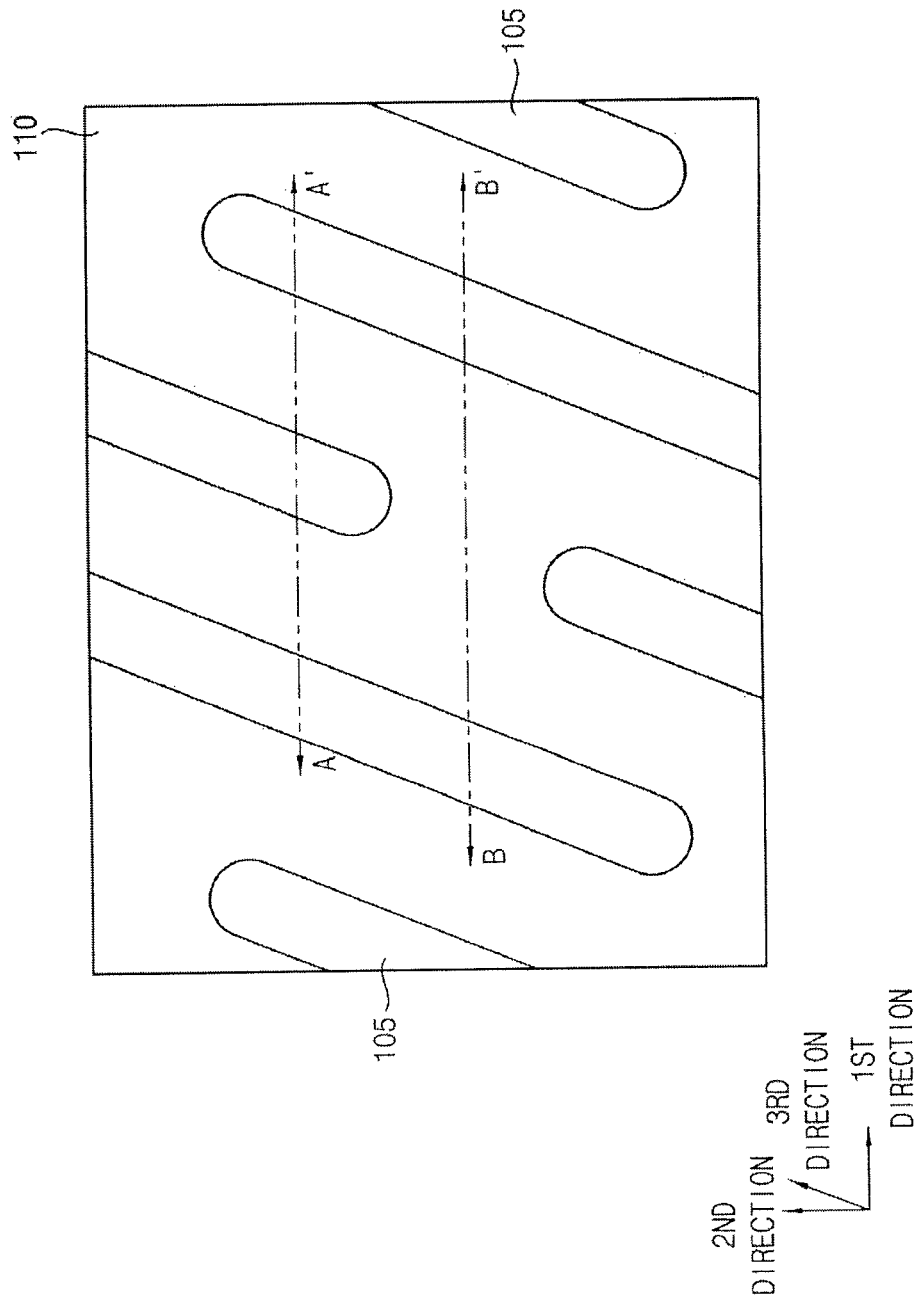
FIGS. 1, 3, 5, 7, 10, 17, 19, 23, and 26 illustrate plan views of stages in a method of manufacturing a semiconductor device in accordance with example embodiments.
Figure 2:
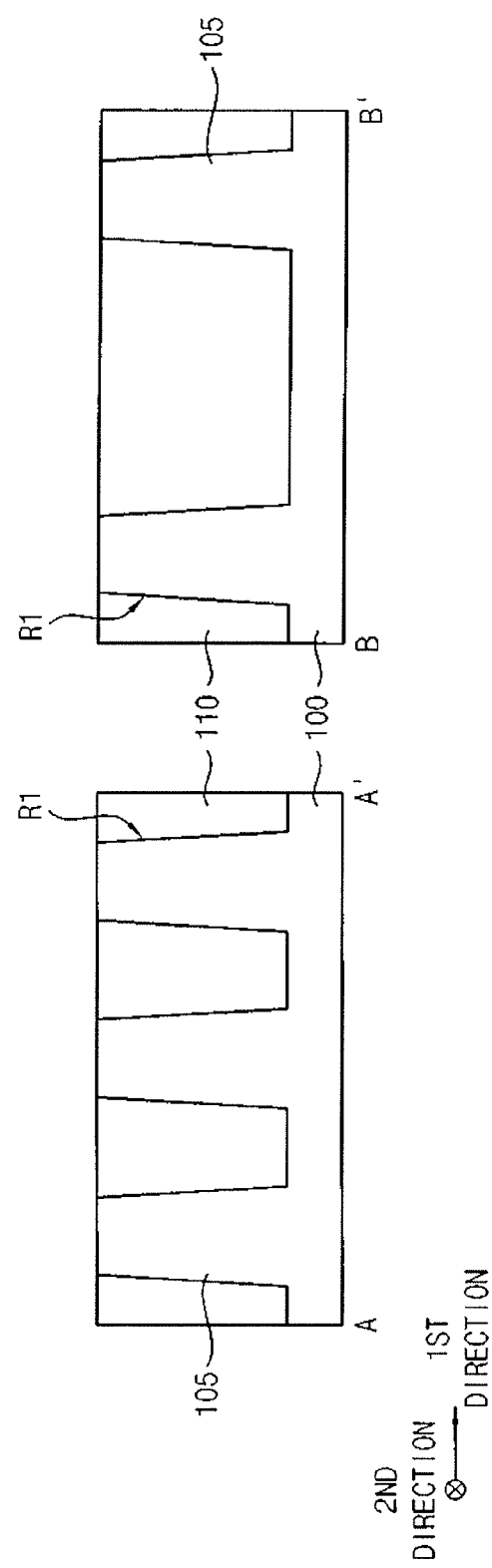

Referring to FIGS. 1 and 2, an active pattern 105 may be formed on a substrate 100, and an isolation pattern 110 may be formed to cover a sidewall of the active pattern 105.

The substrate 100 may include a semiconductor material, e.g., silicon, germanium, silicon-germanium, etc., or III-V semiconductor compounds, e.g., GaP, GaAs, GaSb, etc. In an example embodiment, the substrate 100 may be a silicon-on-insulator (SOI) substrate or a germanium-on-insulator (GOI) substrate.

In example embodiments, a plurality of active patterns 105 may be formed to be spaced apart from each other in each of first and second directions, which may be substantially parallel to an upper surface of the substrate 100 and substantially perpendicular to each other, and each of the plurality of active patterns 105 may extend in a third direction having an acute angle with respect to the first and second directions.

The active pattern 105 may be formed by removing an upper portion of the substrate 100 to form a first recess R1, and the isolation pattern 110 may be formed by forming an isolation layer on the substrate 100 to fill the first recess R1 and planarizing the isolation layer until an upper surface of the active pattern 105 is exposed. The planarization process may include a chemical mechanical polishing (CMP) process and/or an etch back process.

Figure 3:
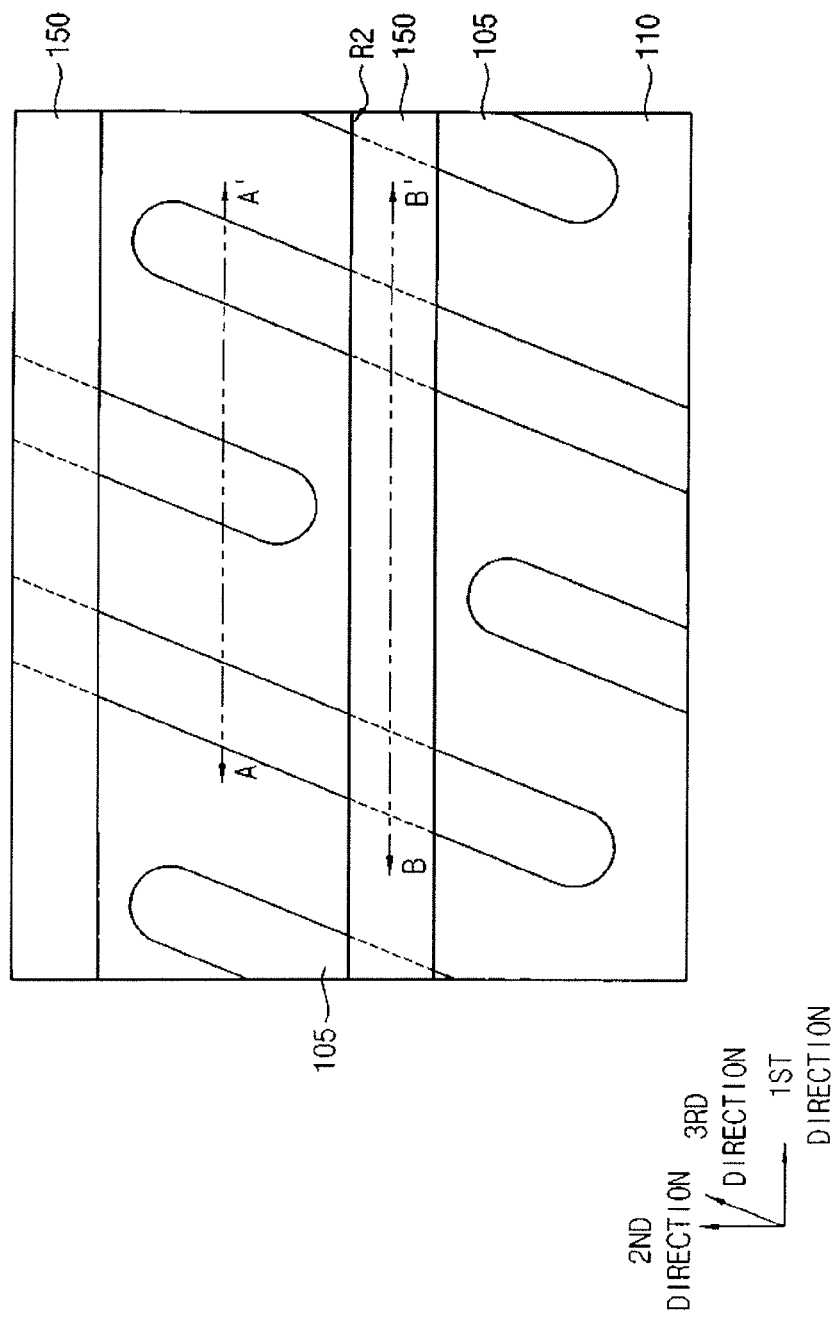
Figure 4:
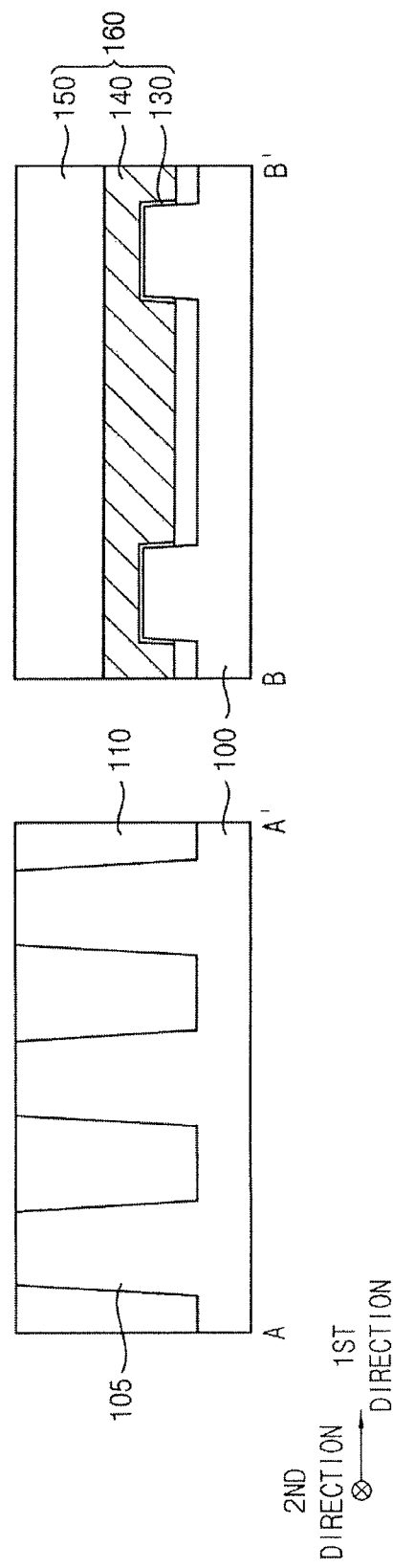

Referring to FIGS. 3 and 4, an ion implantation process may be performed onto the substrate 100 to form an impurity region, and the active pattern 105 and the isolation pattern 110 may be partially etched to form a second recess R2 extending in the first direction.

A gate structure 160 may be formed in the second recess R2. The gate structure 160 may include a gate insulation layer 130 on a surface of the active pattern 105 exposed by the second recess R2, a gate electrode 140 filling a lower portion of the second recess R2 on the gate insulation layer 130, and a first capping pattern 150 filling an upper portion of the second recess R2 on the gate electrode 140. The gate structure 160 may extend in the first direction, and a plurality of gate structures 160 may be formed in the second direction. It is noted that the first capping patterns 150 illustrated in FIG. 3 indicate tops of the gate structures 160 in the second recesses R2, while the right side of FIG. 4 (cross-section along line B-B') indicates a cross-section through the second recess R2.

In example embodiments, the gate insulation layer 130 may be formed by a thermal oxidation process on the surface of the active pattern 105 exposed by the second recess R2, and thus may include an oxide, e.g., silicon oxide.

The gate electrode 140 may be formed by forming a gate electrode layer on the gate insulation layer 130 and the isolation pattern 110 to sufficiently fill the second recess R2, and removing an upper portion of the gate electrode layer by a CMP process and/or an etch back process. Thus, the gate electrode 140 may be formed in the lower portion of the second recess R2. The gate electrode layer may include a metal, e.g., tungsten, titanium, tantalum, etc., or a metal nitride, e.g., tungsten nitride, titanium nitride, tantalum nitride, etc.

The first capping pattern 150 may be formed by forming a first capping layer on the gate electrode 140, the gate insulation layer 130, and the isolation pattern 110 to fill a remaining portion of the second recess R2, and planarizing an upper portion of the first capping layer until an upper surface of the isolation pattern 110 may be exposed. The first capping pattern 150 may be formed in the upper portion of the second recess R2. The first capping layer may include a nitride, e.g., silicon nitride.

Figure 5:
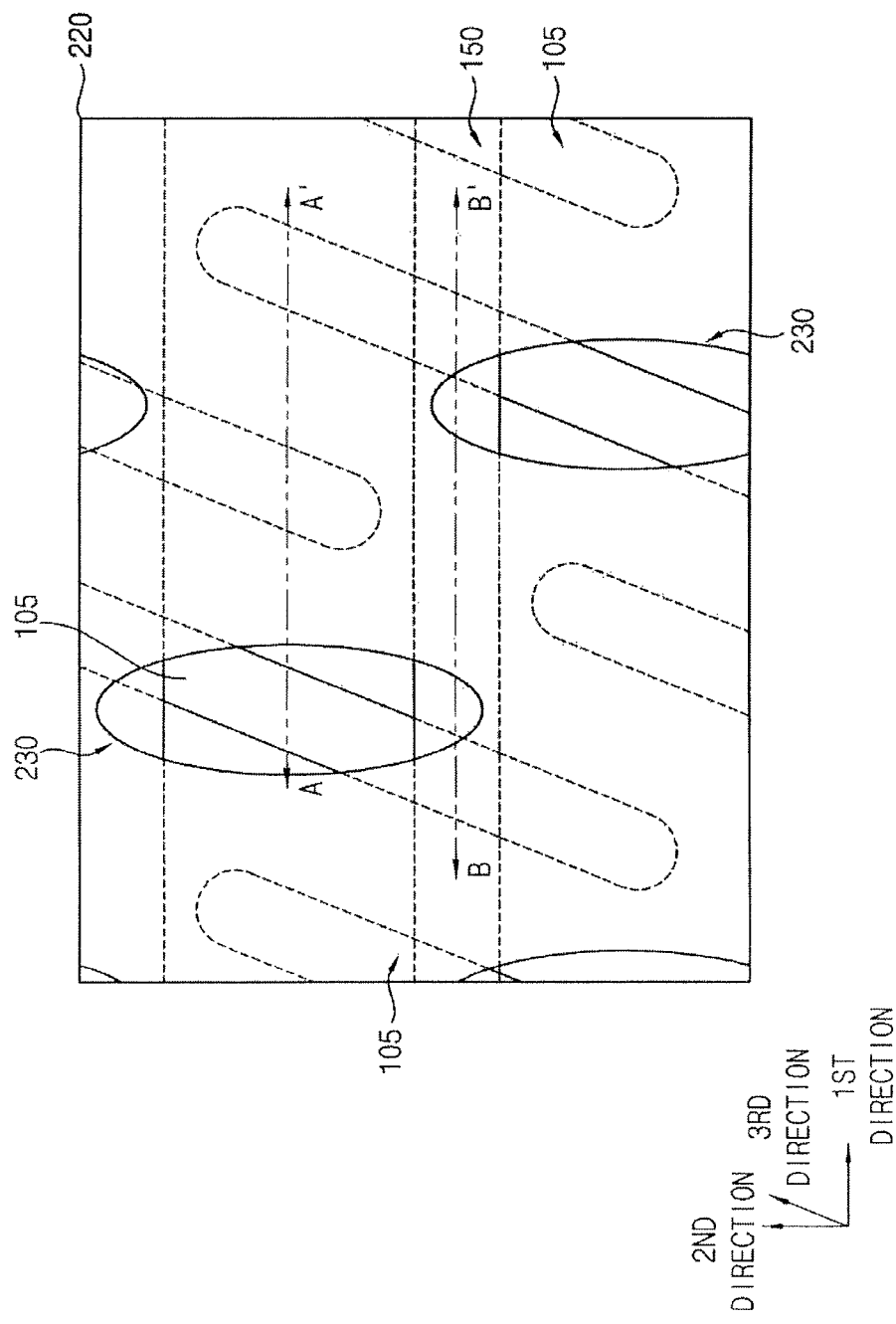
Figure 6:
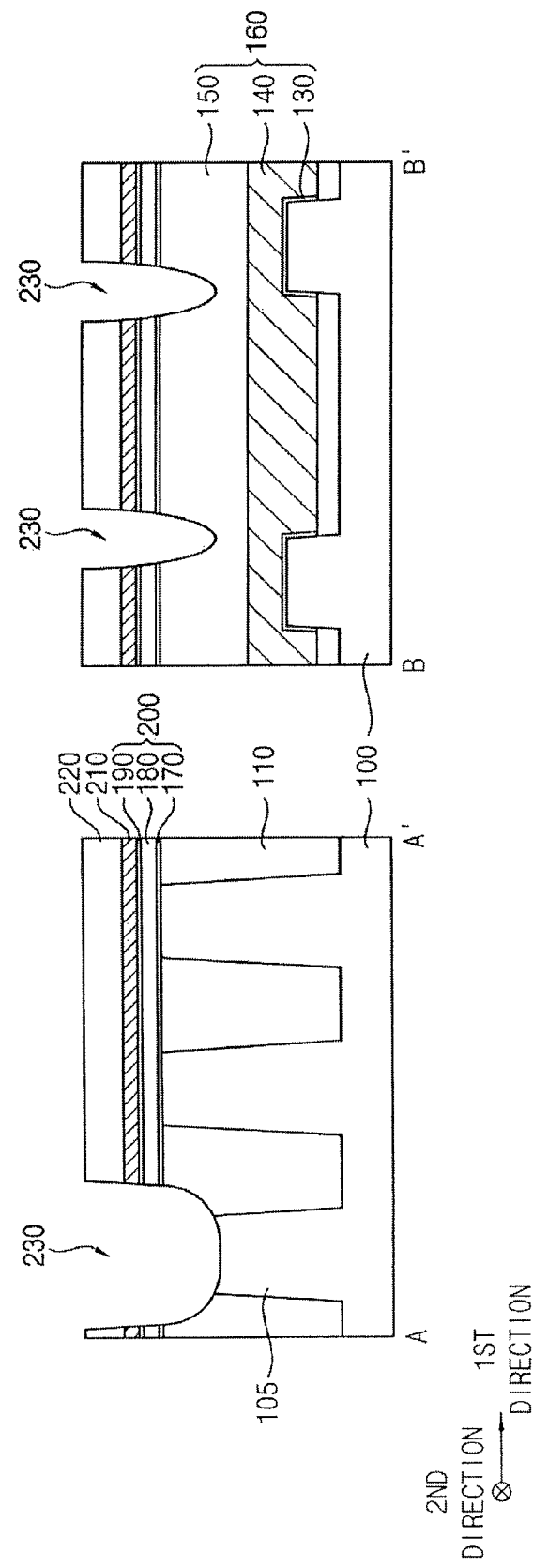

Referring to FIGS. 5 and 6, an insulation layer structure 200, a first conductive layer 210, and a first etching mask 220 may be sequentially formed on the active pattern 105, the isolation pattern 110, and the first capping pattern 150. The first conductive layer 210 and the insulation layer structure 200 may be etched using the first etching mask 220 to form a first opening 230 exposing the active pattern 105. For example, as illustrated in FIG. 5, the first etching mask 220 may include openings, so the first openings 230 may be formed through the openings of the first etching mask 220 to have same shapes and positions.

In example embodiments, the insulation layer structure 200 may include first, second, and third insulation layers 170, 180 and 190 sequentially stacked. The first insulation layer 170 may include an oxide, e.g., silicon oxide, the second insulation layer 180 may include a nitride, e.g., silicon nitride, and the third insulation layer 190 may include an oxide, e.g., silicon oxide.

The first conductive layer 210 may include, e.g., doped polysilicon, and the first etching mask 220 may include a nitride, e.g., silicon nitride.

During the etching process, an upper portion of the active pattern 105 exposed by the first opening 230 and an upper portion of the isolation pattern 110 adjacent thereto, and an upper portion of the first capping pattern 150 may be also etched to form a third recess. That is, a bottom of the first opening 230 may be referred to as the third recess. In example embodiments, the first opening 230 may expose a central upper surface of each of the active patterns 105 extending in the third direction, and thus a plurality of first openings 230 may be formed in each of the first and second directions.

Figure 7:
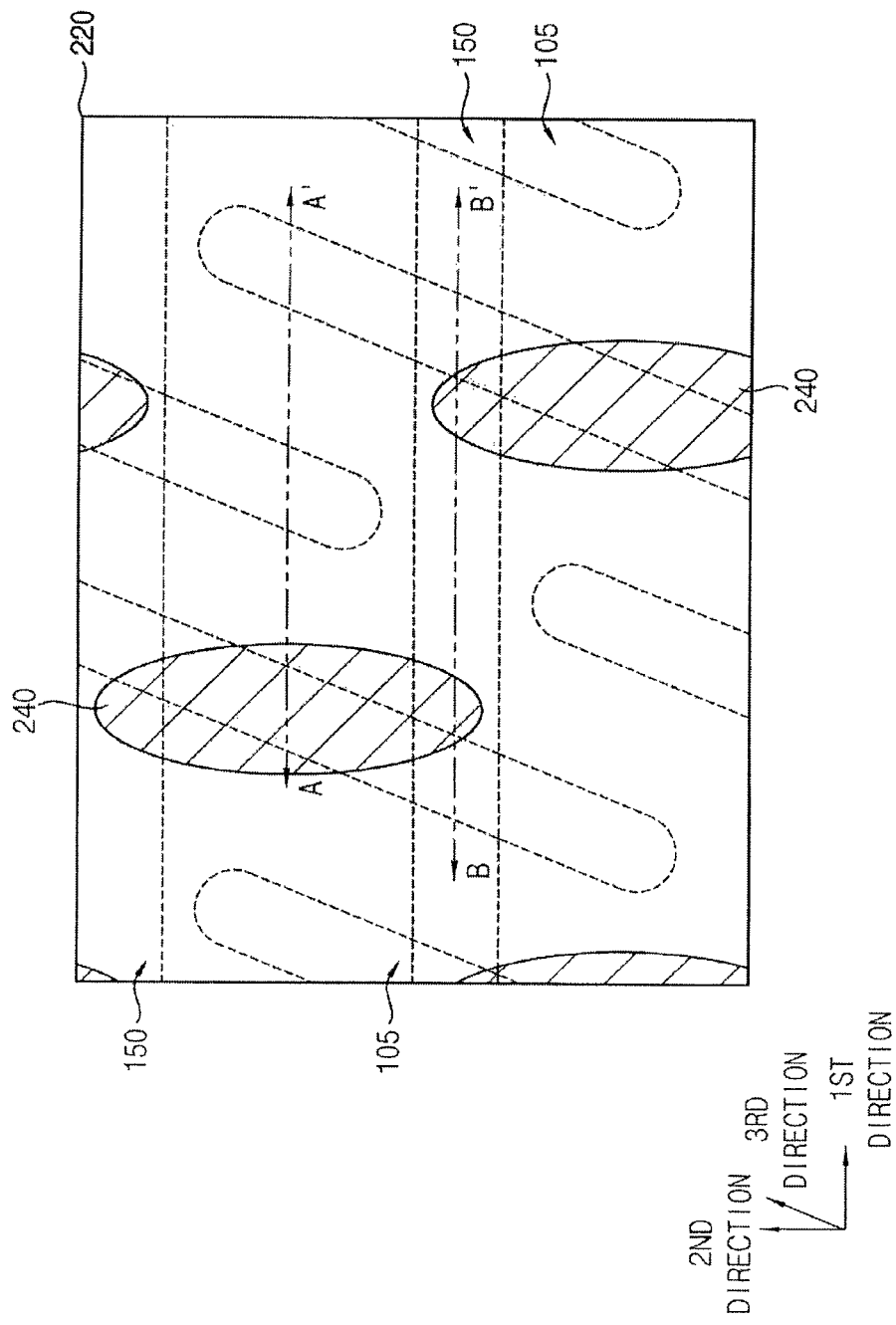
Figure 8:
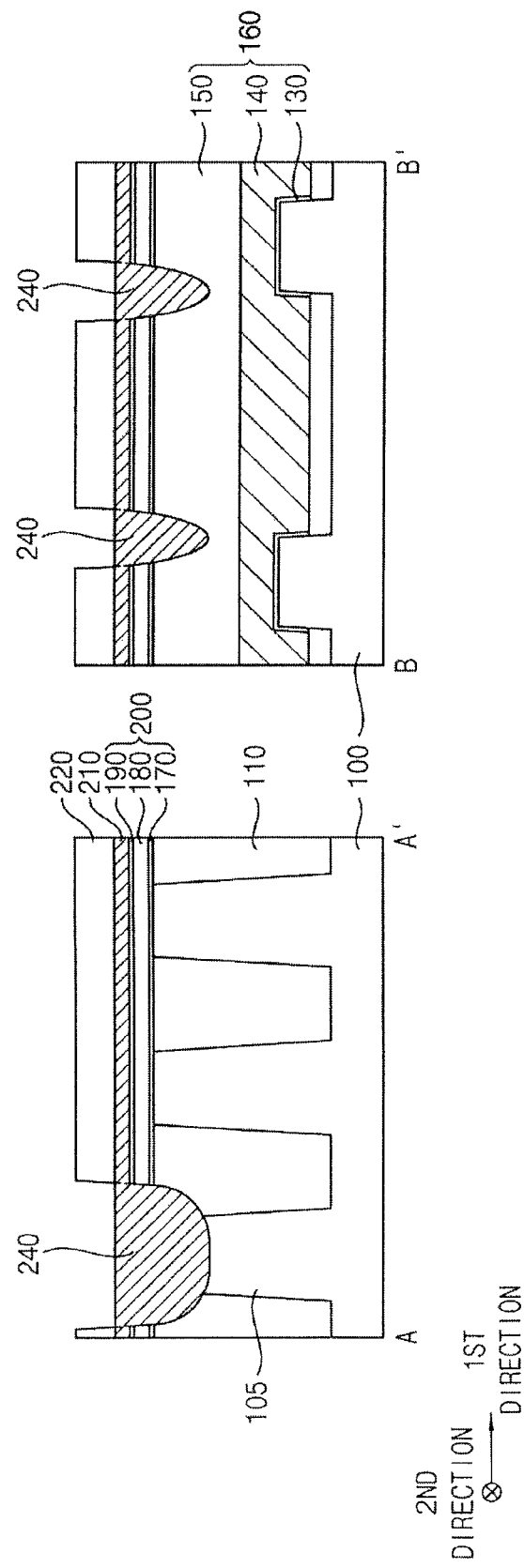

Referring to FIGS. 7 and 8, a second conductive layer 240 may be formed to fill the first opening 230.

In example embodiments, the second conductive layer 240 may be formed by forming a preliminary second conductive layer on the active pattern 105, the isolation pattern 110, the first capping pattern 150, and the first etching mask 220 to fill the first opening 230, and removing an upper portion of the preliminary second conductive layer by a CMP process and/or an etch back process. The second conductive layer 240 may be formed to have an upper surface substantially coplanar with an upper surface of the first conductive layer 210.

In example embodiments, a plurality of second conductive layers 240 may be formed to be spaced apart from each other in each of the first and second directions, e.g., in each of the openings 230. The second conductive layer 240 may include, e.g., doped polysilicon, and thus may be merged with the first conductive layer 210.

Figure 9:
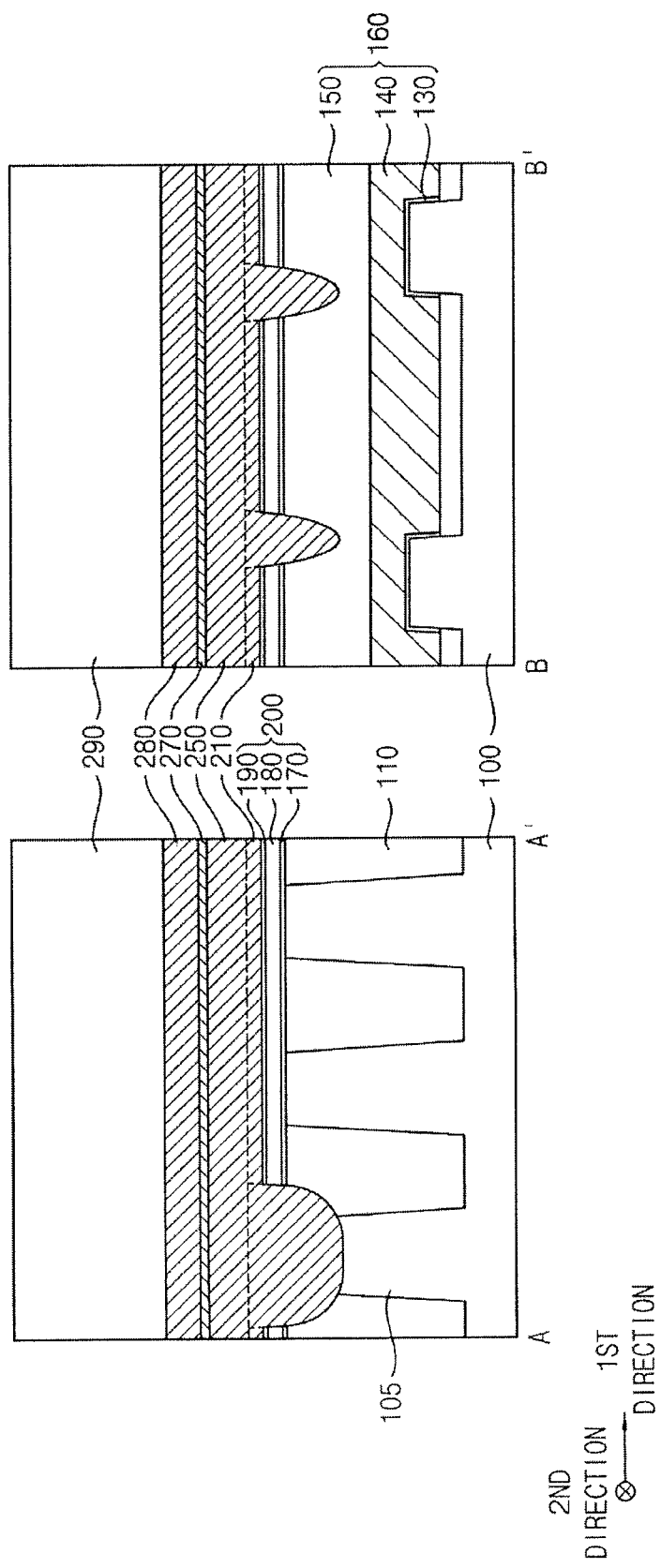

Referring to FIG. 9, after removing the first etching mask 220, a third conductive layer 250, a barrier layer 270, a first metal layer 280, and a second capping layer 290 may be sequentially formed on the first and second conductive layers 210 and 240. For example, referring to FIGS. 7 and 9, the third conductive layer 250, the barrier layer 270, the first metal layer 280, and the second capping layer 290 may cover the entire upper surface of the substrate 100.

In example embodiments, the third conductive layer 250 may include a material substantially the same as that of the first and second conductive layers 210 and 240. That is, the third conductive layer 250 may include doped polysilicon, and thus may be merged with the first and second conductive layers 210 and 240, e.g., the first through third conductive layers 210, 240, and 250 may define a single and integral structure that includes, e.g., consists of, a same material.

The barrier layer 270 may include a metal, e.g., titanium, tantalum, etc., and/or a metal nitride, e.g., titanium nitride, tantalum nitride, etc. The first metal layer 280 may include a metal, e.g., tungsten. The second capping layer 290 may include a nitride, e.g., silicon nitride.

Figure 10:
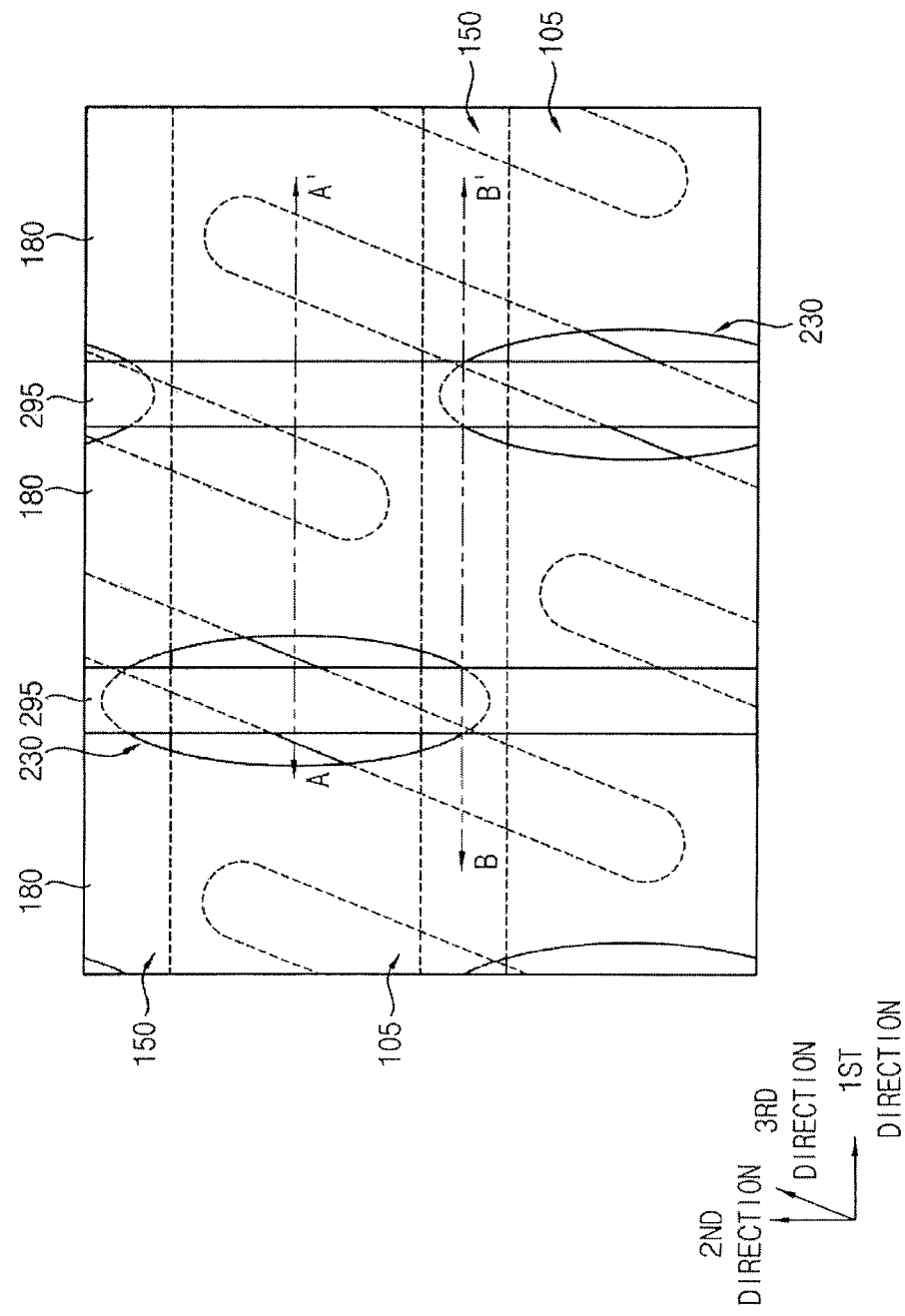
Figure 11:
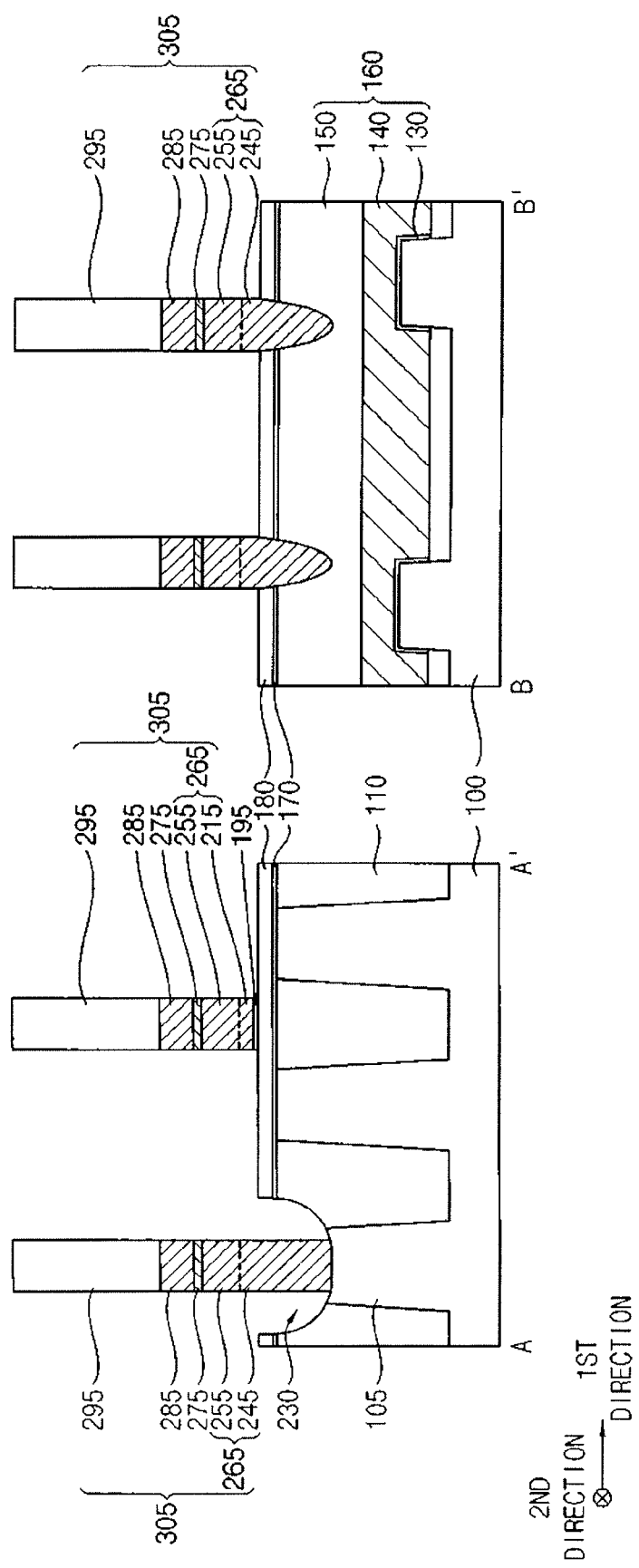

Referring to FIGS. 10 and 11, the second capping layer 290 may be etched to form a second capping pattern 295, and the first metal layer 280, the barrier layer 270, the third conductive layer 250, and the first and second conductive layers 210 and 240 may be sequentially etched using the second capping pattern 295 as an etching mask, and the third insulation layer 190 at an uppermost level of the insulation layer structure 200 may be also etched. For example, as illustrated in FIG. 10, the resultant layered structure may have a linear shape extending in the second direction under the second capping pattern 295.

Thus, a second conductive pattern 245, a third conductive pattern 255, a barrier pattern 275, a first metal pattern 285, and the second capping pattern 295 may be sequentially stacked on the active pattern 105, the isolation pattern 110, and the first capping pattern 150 in the first opening 230. A third insulation pattern 195, a first conductive pattern 215, the third conductive pattern 255, the barrier pattern 275, the first metal pattern 285, and the second capping pattern 295 may be sequentially stacked on the second insulation layer 180 of the insulation layer structure 200 outside of the first opening 230. For example, referring to FIGS. 10-11, while the resultant layered structure under the second capping pattern 295 extends, e.g., continuously, in the second direction (e.g., right capping pattern 295 in FIG. 10), some of the layered structure may be in the first opening 230 (e.g., rightmost structure along the B-B' line in FIG. 11) while some of the layered structure may be on the second insulation layer 180 (e.g., rightmost structure along the A-A' line in FIG. 11).

As described above, the first to third conductive layers 210, 240 and 250 may be merged with each other, and thus the second and third conductive patterns 245 and 255 sequentially stacked in the openings 230, and the first and third conductive patterns 215 and 255 sequentially stacked outside the openings 230, may form one conductive pattern structure 265. Hereinafter, the conductive pattern structure 265, the barrier pattern 275, the first metal pattern 285, and the second capping pattern 295 sequentially stacked may be referred to as a bit line structure 305. In example embodiments, the bit line structure 305 may extend in the second direction (into the page of FIG. 11), and a plurality of bit line structures 305 may be formed in the first direction, i.e., to be spaced apart from each other in the first direction.

Figure 12:
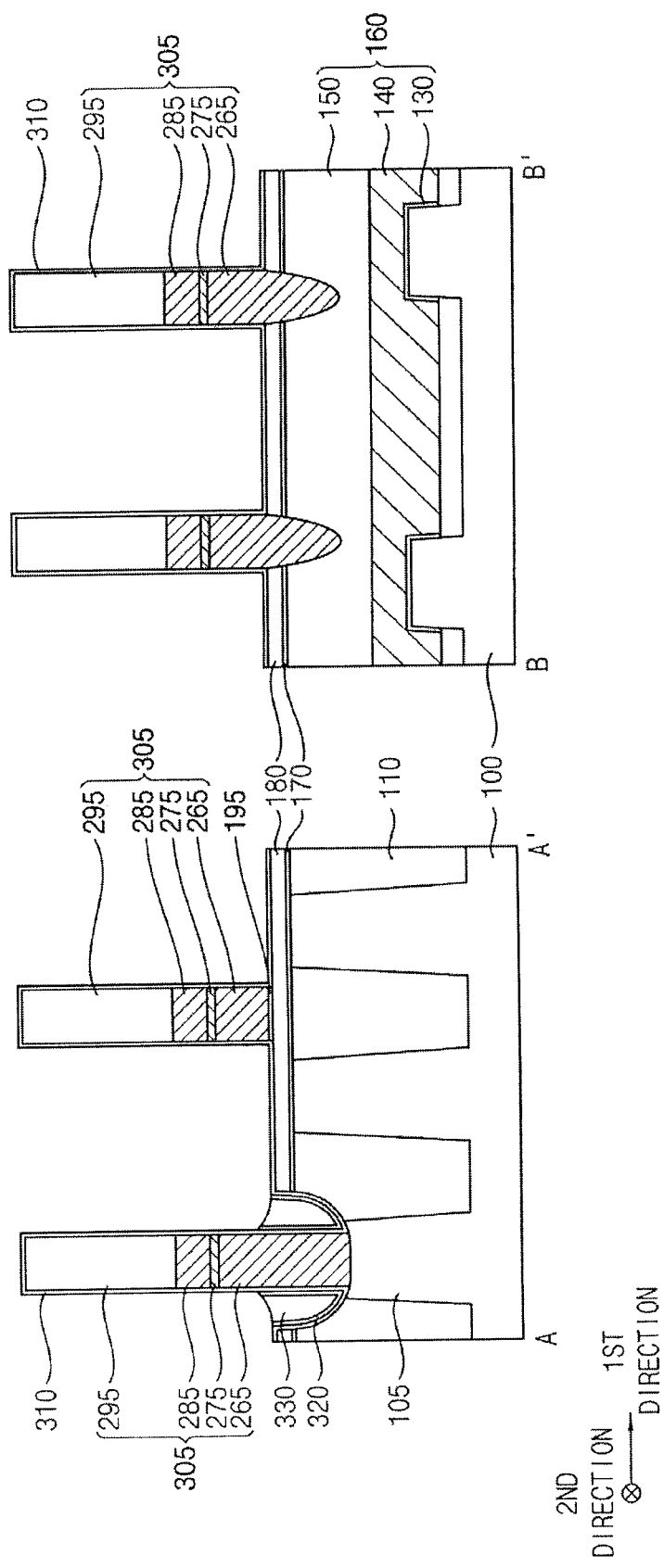

Referring to FIG. 12, a first spacer layer 310 may be formed on the exposed upper surfaces of the active pattern 105, the isolation pattern 110 and the first capping pattern 150, a sidewall of the first opening 230, and the second insulation layer 180 to cover the bit line structure 305. Fourth and fifth insulation layers may be sequentially formed on the first spacer layer 310. For example, the fourth insulation layer may be formed conformally on the first spacer layer 310, e.g., on the bit line structure 305 and to trace a portion of the first opening 230 external to the bit line structure 305, and the fifth insulation layer may be formed on the fourth insulation layer, e.g., to fill a remaining portion of the first opening 230.

The first spacer layer 310 may cover a sidewall of the third insulation pattern 195 under the bit line structure 305 on the second insulation layer 180. The first spacer layer 310 may include a nitride, e.g., silicon nitride. The fourth insulation layer may include an oxide, e.g., silicon oxide, and the fifth insulation layer may include a nitride, e.g., silicon nitride. The fifth insulation layer may sufficiently fill the first opening 230.

The fourth and fifth insulation layers may be etched by an etching process. In example embodiments, the etching process may include a wet etching process, and all portions of the fourth and fifth insulation layers, except for a portion thereof in the first opening 230 (FIG. 12), may be removed. Thus, almost an entire surface of the first spacer layer 310, i.e., all portions of the first spacer layer 310 except for a portion thereof in the first opening 230, may be exposed, and portions of the fourth and fifth insulation layers remaining in the first opening 230 may form fourth and fifth insulation patterns 320 and 330, respectively.

Figure 13:
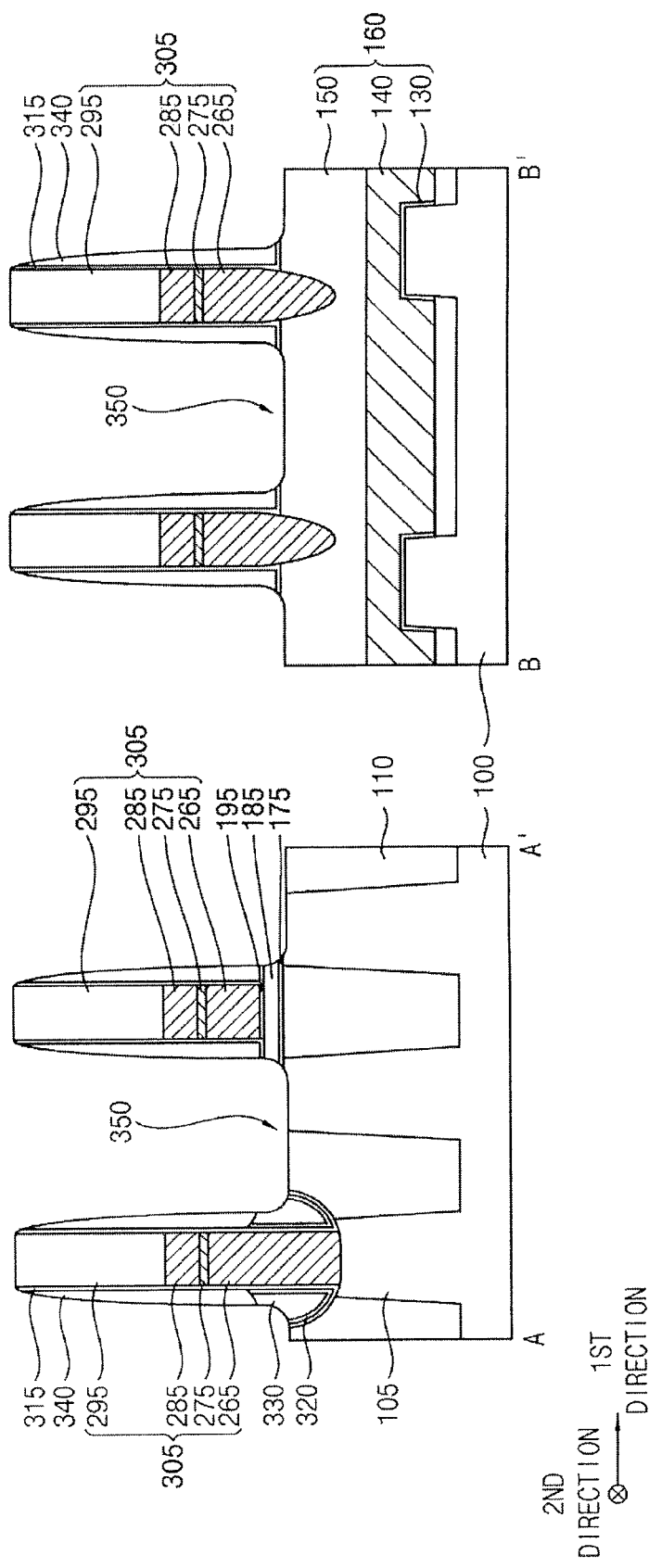

Referring to FIG. 13, a second spacer layer may be formed on the exposed surface of the first spacer layer 310 and the portions of the fourth and fifth insulation patterns 320 and 330 in the first opening 230, e.g., the second spacer layer may completely cover the exposed surface of the first spacer layer 310 and the portions of the fourth and fifth insulation patterns 320 and 330 in the first opening 230. The second spacer layer may be anisotropically etched to form a second spacer 340 on the surface of the first spacer layer 310 and the fourth and fifth insulation patterns 320 and 330 to cover a sidewall of the bit line structure 305, as illustrated in FIG. 13. The second spacer 340 may include an oxide, e.g., silicon oxide.

A dry etching process may be performed using the second capping pattern 295 and the second spacer 340 as an etching mask to form a second opening 350 exposing an upper surface of the active pattern 105, and upper surfaces of the isolation pattern 110 and the first capping pattern 150 may be also exposed by the second opening 350. By the dry etching process, portions of the first spacer layer 310 on the second capping pattern 295 and the second insulation layer 180 may be removed, and thus a first spacer 315 may be formed to cover the sidewall of the bit line structure 305. During the dry etching process, the first and second insulation layers 170 and 180 may be partially removed to form first and second insulation patterns 175 and 185, respectively. The first to third insulation patterns 175, 185 and 195 sequentially stacked under the bit line structure 305 may form an insulation pattern structure. For example, each of the first and second spacers 315 and 340 may extend, e.g., continuously, along an entire length of each of the sidewalls of the bit line structures 305 in the second direction.

Figure 14:
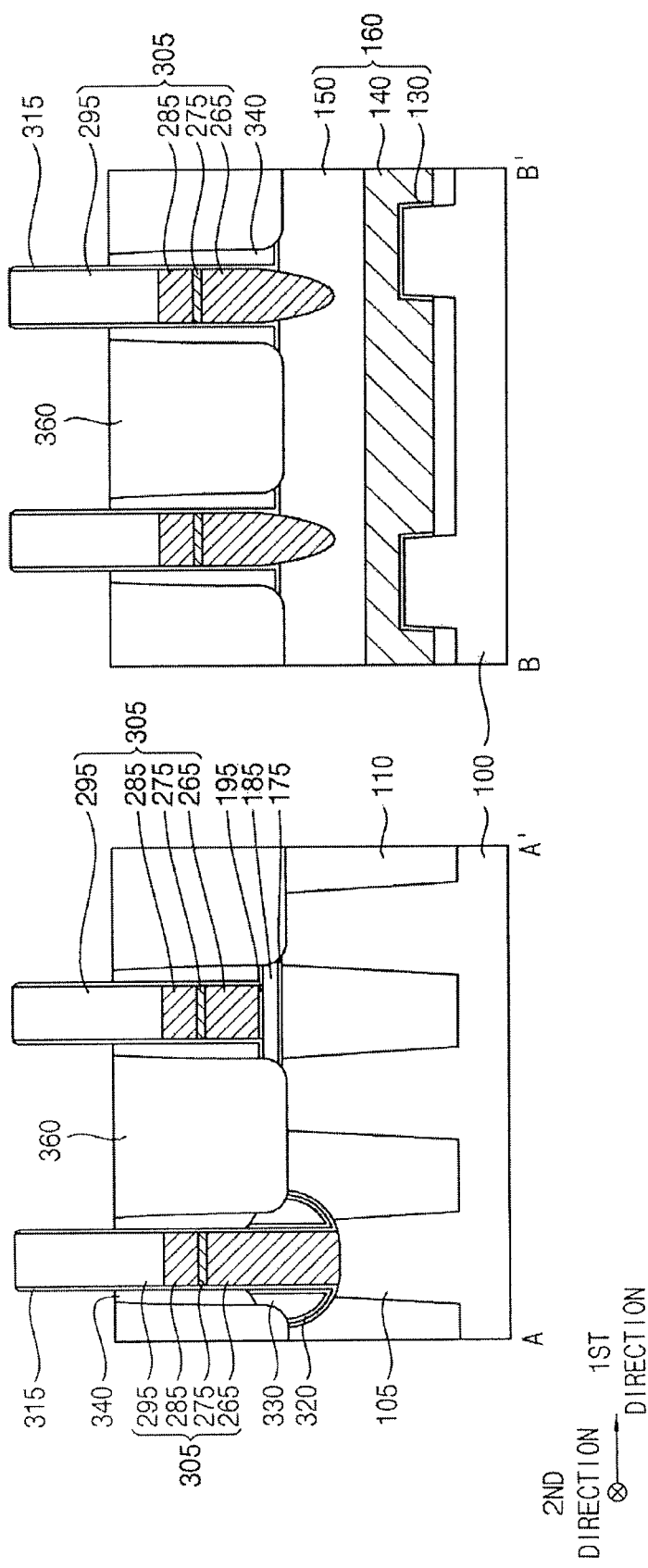

Referring to FIG. 14, a first sacrificial pattern 360 may be formed to fill the second opening 350 and cover a lower portion of the second spacer 340 on the sidewall of the bit line structure 305, e.g., an upper portion of the second spacer 340 may remain exposed. The first sacrificial pattern 360 may be formed by forming a first sacrificial layer to fill the second opening 350 and cover the bit line structure 305, e.g., along the entire length in the second direction, and removing an upper portion of the first sacrificial layer. The first sacrificial layer may include, e.g., silicon-on-hardmask (SOH), amorphous carbon layer (ACL), etc.

The upper portion of the first sacrificial layer may be removed by a CMP process and/or an etch back process. In example embodiments, an upper surface of the first sacrificial pattern 360 may be higher than that of the first metal pattern 285.

An upper portion of the second spacer 340 not covered by the first sacrificial pattern 360 may be removed. In example embodiments, the upper portion of the second spacer 340 may be removed by a wet etching process. As illustrated in FIG. 14, only the upper portion of the second spacer 340 on the sidewall of the bit line structure 305 not covered by the first sacrificial pattern 360 may be removed, and the upper surface of the first sacrificial pattern 360 may have a constant height by the planarization process, so that a remaining portion of the second spacer 340 after the etching process may have a constant height. For example, as illustrated in FIG. 14, upper surfaces of the first sacrificial pattern 360 and the second spacer 340 may be at a constant height and level with each other.

Figure 15:
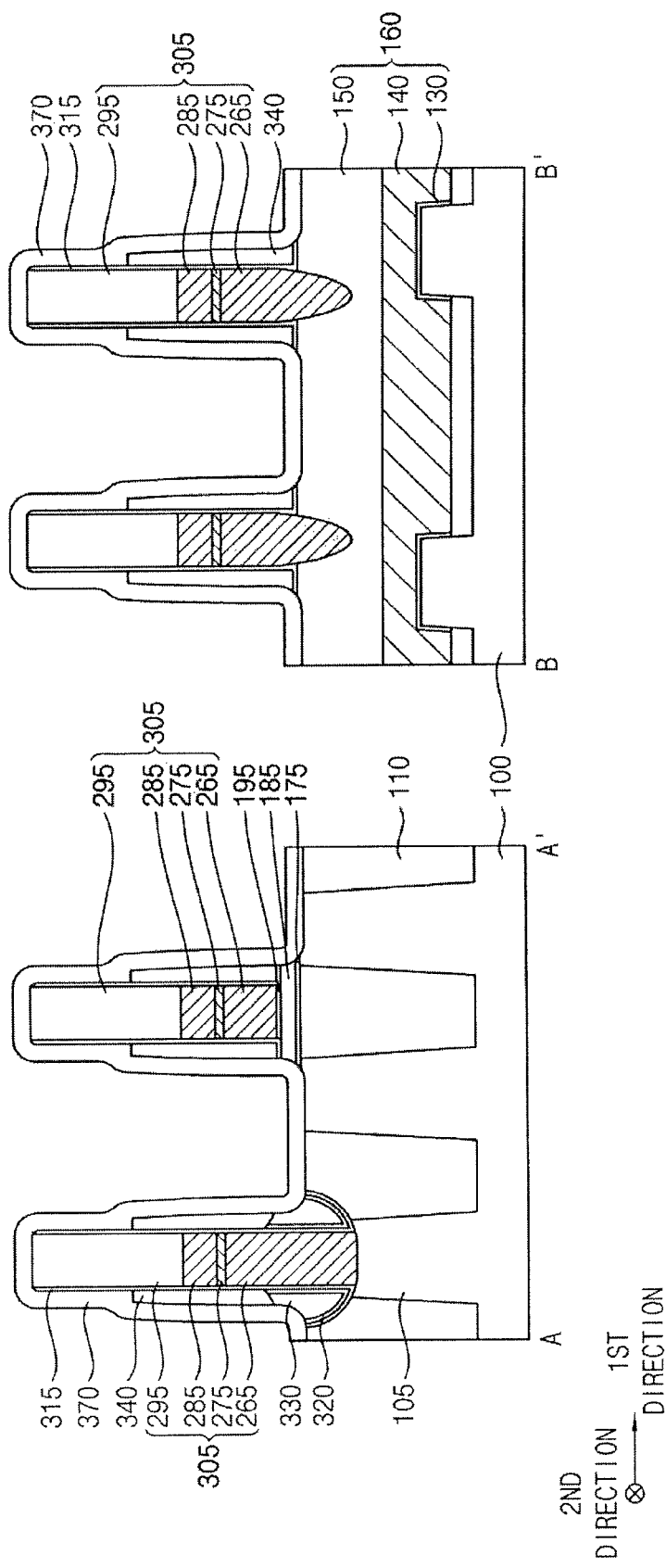

Referring to FIG. 15, the first sacrificial pattern 360 may be removed, and a third spacer layer 370 may be, e.g., conformally, formed on an upper surface of the second capping pattern 295 of the bit line structure 305, a portion of the first spacer 315 on an upper sidewall of the second capping pattern 295, the second spacer 340, portions of upper surfaces of the fourth and fifth insulation patterns 320 and 330, the active pattern 105 exposed by the second opening 350, the isolation pattern 110, and an upper surface of the first capping pattern 150. The third spacer layer 370 may include a nitride, e.g., silicon nitride.

Figure 16:
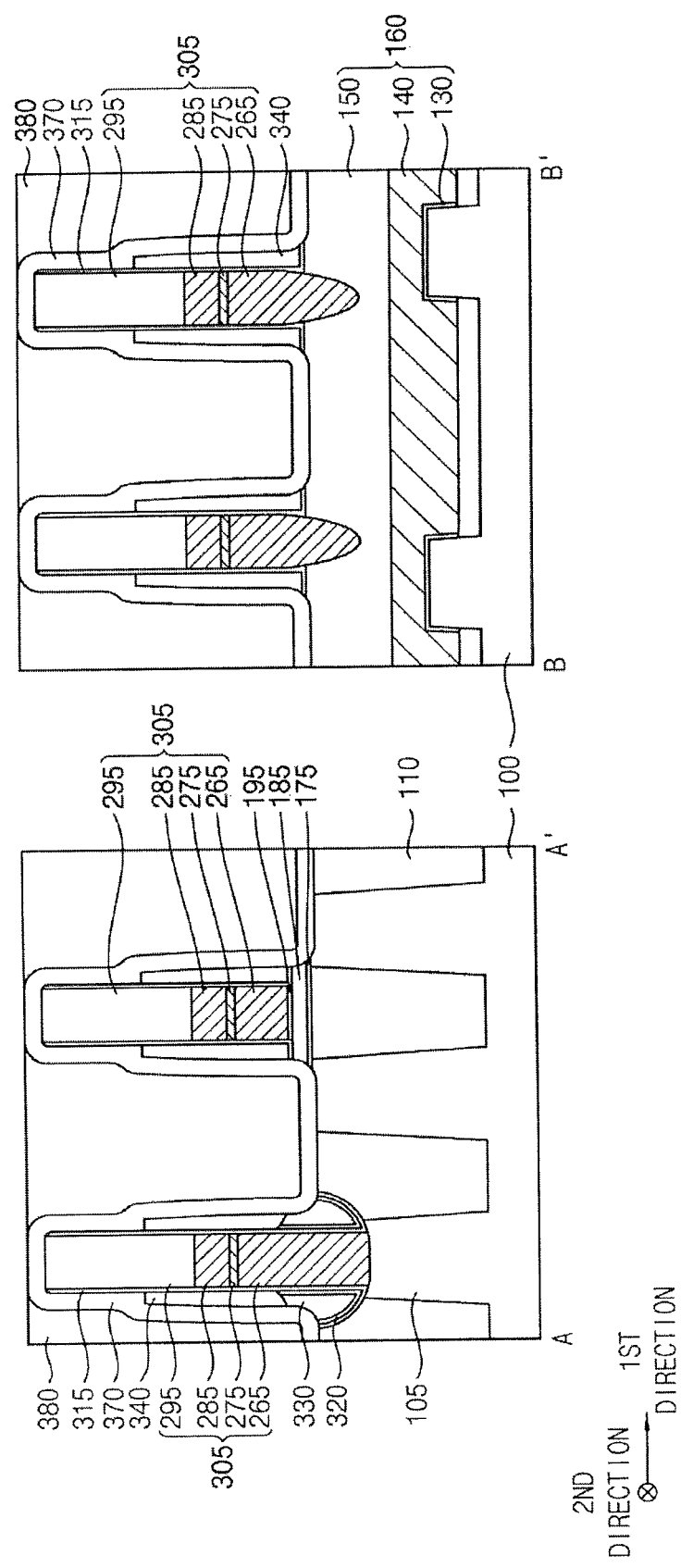

Referring to FIG. 16, a first insulating interlayer 380 may be formed on the third spacer layer 370, e.g., to cover an uppermost surface of the third spacer layer 370. Next, the first insulating interlayer 380 may be planarized until a top surface of the third spacer layer 370 may be exposed, e.g., a top surface of the first insulating interlayer 380 and the third spacer layer 370 may be level with each other. The first insulating interlayer 380 may include an oxide, e.g., silicon oxide, and the planarization process may include a CMP process and/or an etch back process.

Figure 17:
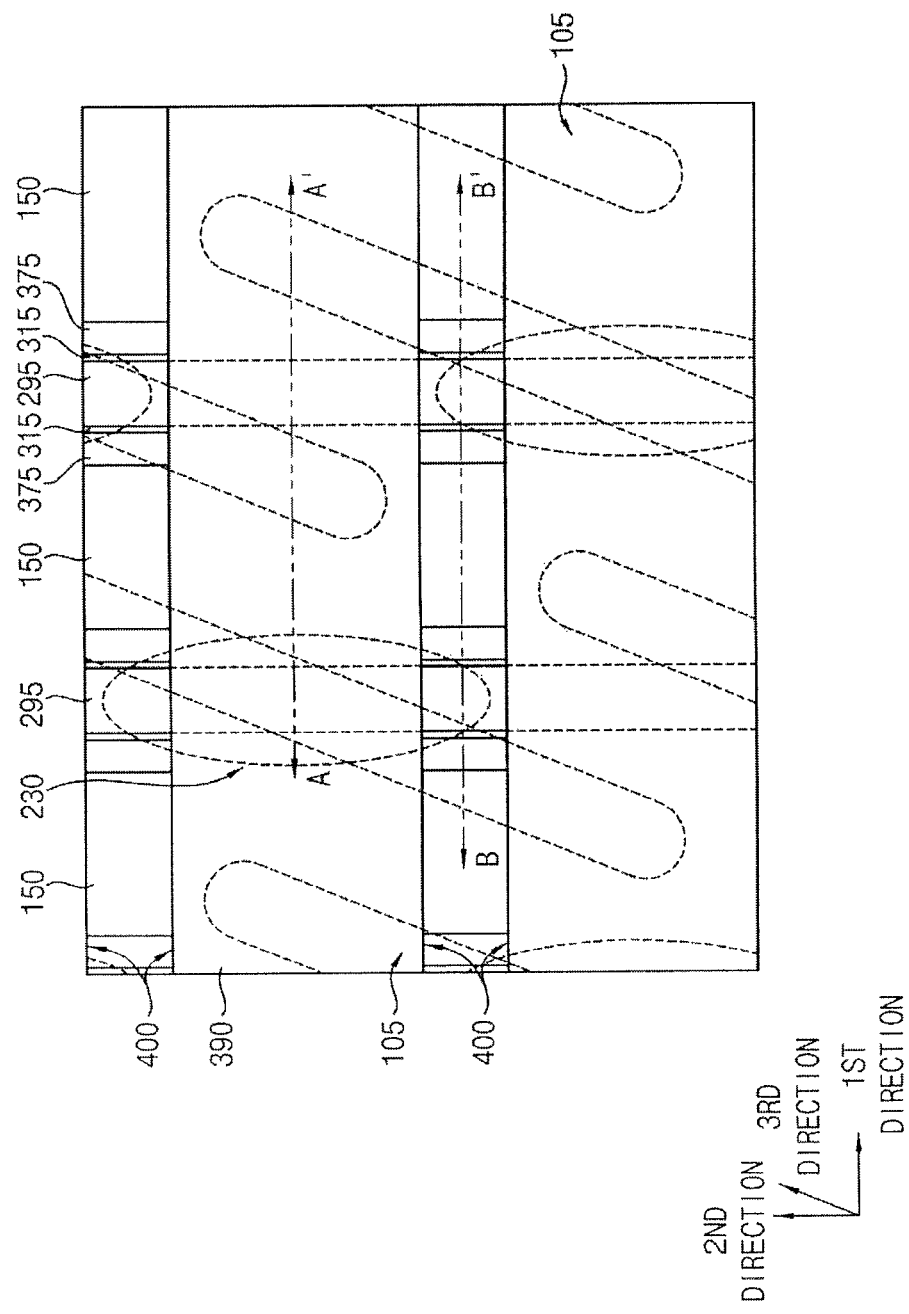
Figure 18:
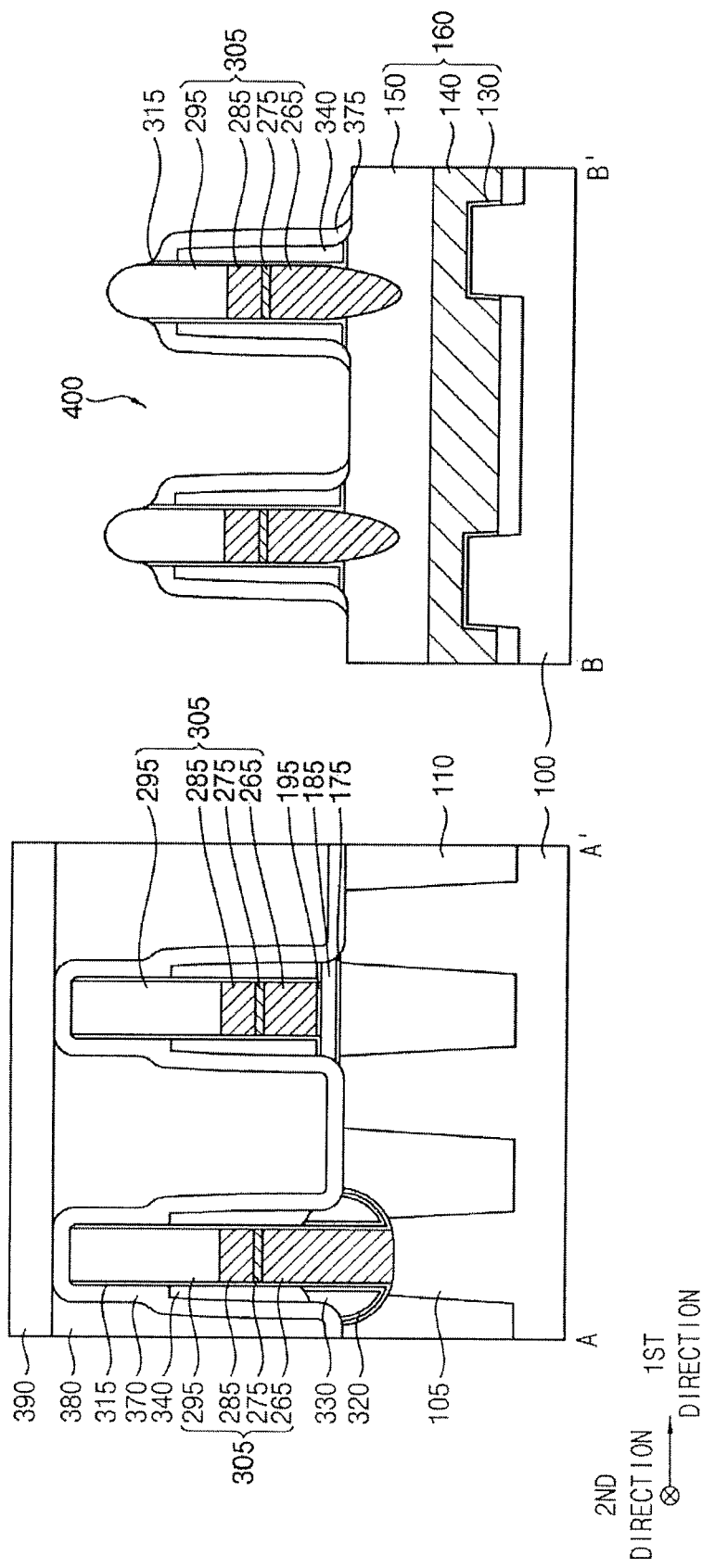

Referring to FIGS. 17 and 18, a second etching mask 390 may be formed on the first insulating interlayer 380 and the exposed top surface of the third spacer layer 370. For example, as illustrated in FIG. 17, linear portions of the second etching mask 390 may extend in the first direction in parallel to each other, such that some of the first insulating interlayer 380 may be exposed between adjacent ones of the linear portions of the second etching mask 390.

The exposed portions of the first insulating interlayer 380 may be etched by a dry etching process using the second etching mask 390 to form a third opening 400. That is, referring to FIG. 17, the first insulating interlayer 380 may be removed to form the third opening 400 between the linear portions of the second etching mask 390, so portions of the bit line structures 305 may be exposed through the third opening 400.

In example embodiments, the second etching mask 390 may extend in the first direction, and a plurality of second etching masks 390 may be formed in the second direction. Each of the second etching masks 390 may not overlap the gate structure 160. That is, the third opening 400 may overlap the gate structure 160.

By the dry etching process, portions of the third spacer layer 370 covering an upper portion of the second capping pattern 295 of the bit line structure 305 and the first capping pattern 150 may be removed to form a third spacer 375 covering the sidewall of the bit line structure 305. Additionally, a portion of the first spacer 315 on the upper sidewall of the second capping pattern 295 and an upper portion of the second capping pattern 295 may be partially removed. For example, as illustrated in FIG. 18, the second spacer 340 may be completely enclosed by the first spacer 315 and the third spacer layer 370 along an entire length of the bit line structures 305 in the second direction, even though the height of the first and third spacers 315 and 375 in the third opening 400 is reduced.

As illustrated with reference to FIG. 15, the upper portion of the second spacer 340 is removed so that the second spacer 340 may not be formed on the upper sidewall of the second capping pattern 295, and thus the second spacer 340 may be sufficiently protected by the third spacer layer 370. Accordingly, the second spacer 340 may not be exposed or damaged by the dry etching process, so that the upper surface of the second spacer 340 may have, e.g., maintain, a constant height.

Figure 19:
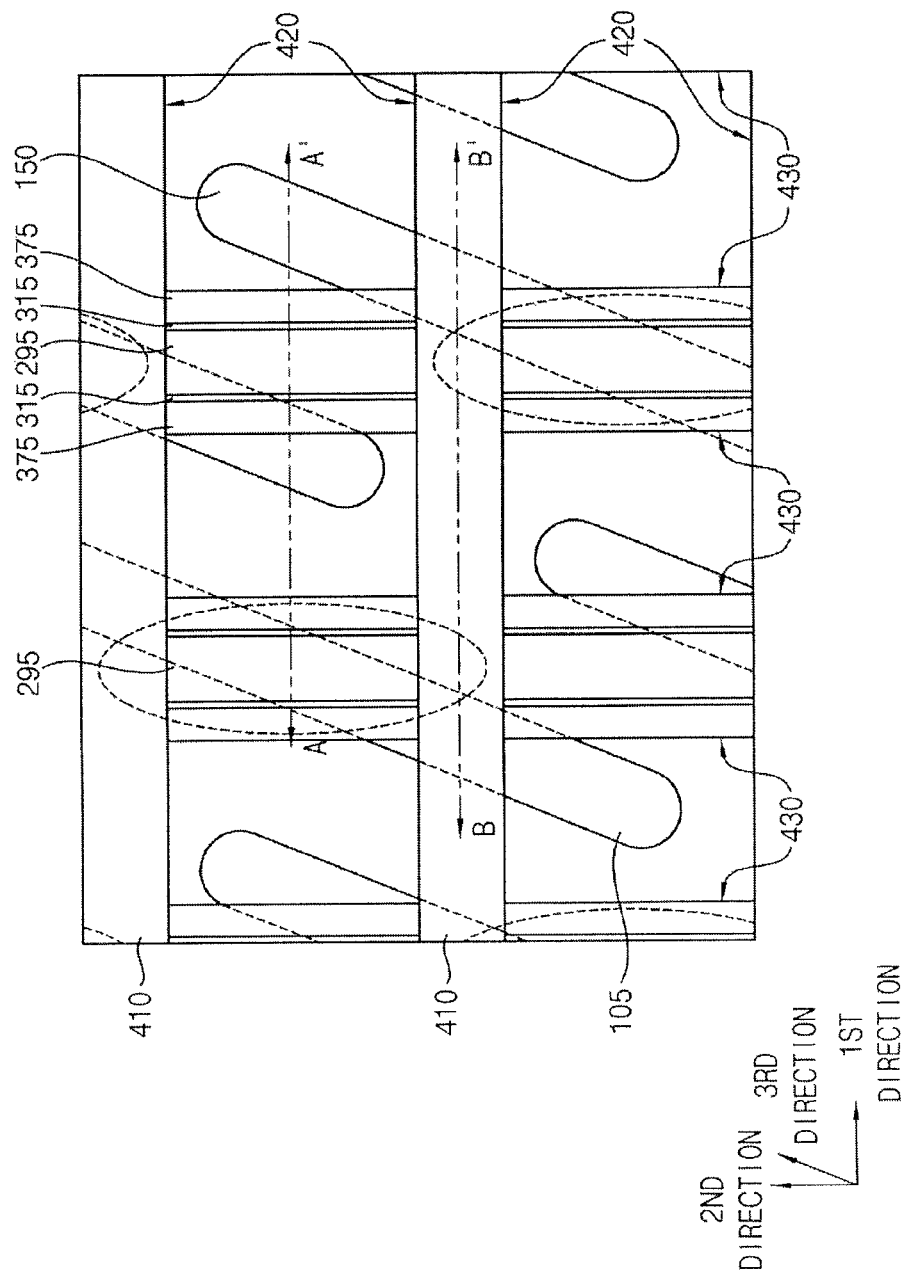
Figure 20:
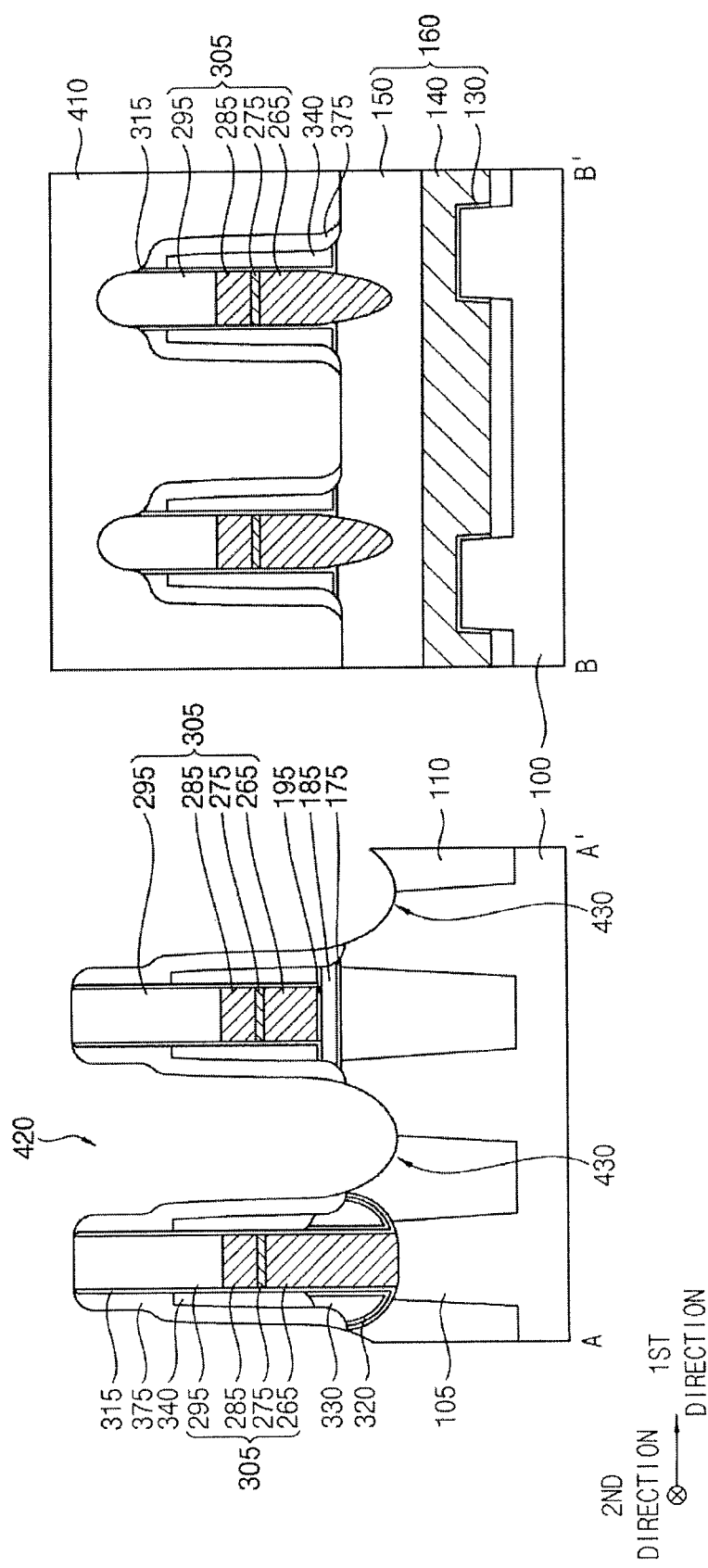

Referring to FIGS. 19 and 20, the second etching mask 390 may be removed to expose an upper surface of the first insulating interlayer 380, and a third capping pattern 410 may be formed to fill the third opening 400. The third capping pattern 410 may be formed by forming a third capping layer on the upper surface of the first capping pattern 150, the upper surface of the second capping pattern 295, the first and third spacers 315 and 375 and the exposed upper surface of the first insulating interlayer 380 to fill the third opening 400, and planarizing the third capping layer until the upper surface of the first insulating interlayer 380 may be exposed.

The third capping pattern 410 may include a nitride, e.g., silicon nitride, and thus may be merged with one or ones of the first and second capping patterns 150 and 295 and the first and third spacers 315 and 375. The planarization process may include a CMP process and/or an etch back process.

The first insulating interlayer 380 of which the upper surface is exposed may be removed to form a fourth opening 420 exposing the third spacer layer 370, e.g., the fourth opening 420 may be defined between adjacent third capping pattern 410 to expose the third spacer layer 370. In example embodiments, the first insulating interlayer 380 may be removed by a wet etching process. Thus, the third spacer layer 370 covering the bit line structure 305 may be rarely removed when compared to the dry etching process for forming the third opening 400.

The exposed third spacer layer 370 may be anisotropically etched to form the third spacer 375 covering the bit line structure 305. The first to third spacers 315, 340 and 375 may be referred to as a preliminary spacer structure. An upper portion of the active pattern 105 may be etched by a dry etching process using the third spacer 375 and the second capping pattern 295 as an etching mask to form a fifth opening 430 connected to the fourth opening 420. That is, the fifth opening 430 may be formed in the active pattern 105 between adjacent bit line structures 305 and in fluid communication with the fourth opening 420, e.g., the fifth opening 430 may be in the bottom of and an extension of the fourth opening 420. During the dry etching process, an upper portion of the isolation pattern 110 adjacent the upper portion of the active pattern 105 may be also etched.

In example embodiments, an upper surface of the portion of the bit line structure 305 exposed by the fourth opening 420 after forming the fourth and fifth openings 420 and 430 (i.e., left side of FIG. 20) may have a height greater than that of an upper surface of the portion of the bit line structure 305 exposed by the third opening 400 (i.e., right side of FIG. 20).

Figure 21:
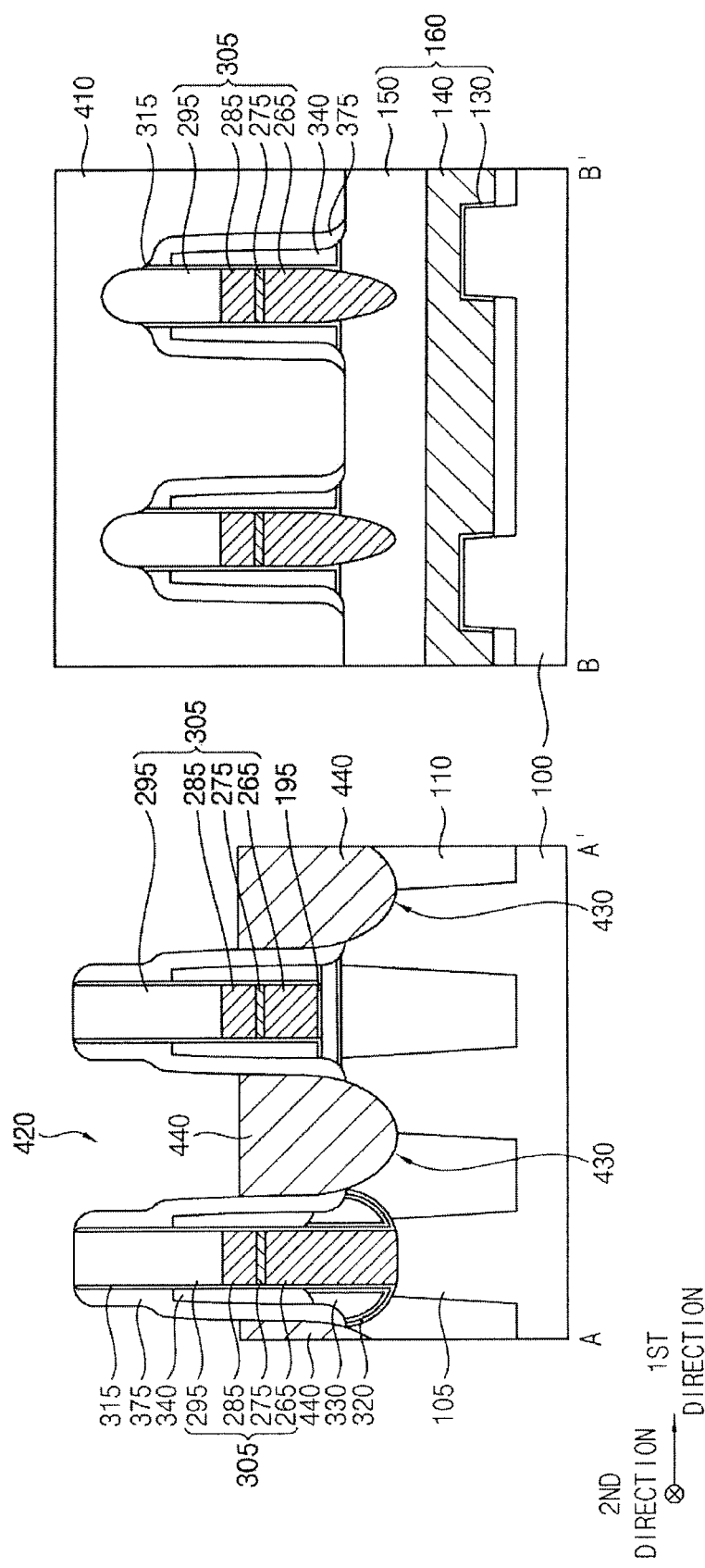

Referring to FIG. 21, a lower contact plug 440 may be formed to fill the fifth opening 430 and a lower portion of the fourth opening 420. The lower contact plug 440 may be formed by forming a fourth conductive layer on the upper surfaces of the active pattern 105 and the isolation pattern 110 exposed by the fifth opening 430, the third spacer 375, the second capping pattern 295, and the third capping pattern 410, and removing an upper portion of the fourth conductive layer. The upper portion of the fourth conductive layer may be removed by a CMP process and/or an etch back process.

The lower contact plug 440 may include, e.g., doped polysilicon. In an example embodiment, an upper surface of the lower contact plug 440 may be lower than that of the first metal pattern 285, however, embodiments are not limited thereto. When the lower contact plug 440 is formed, the fifth opening 430 may not be completely filled, so that an air gap may be formed in the lower contact plug 440.

Figure 22:
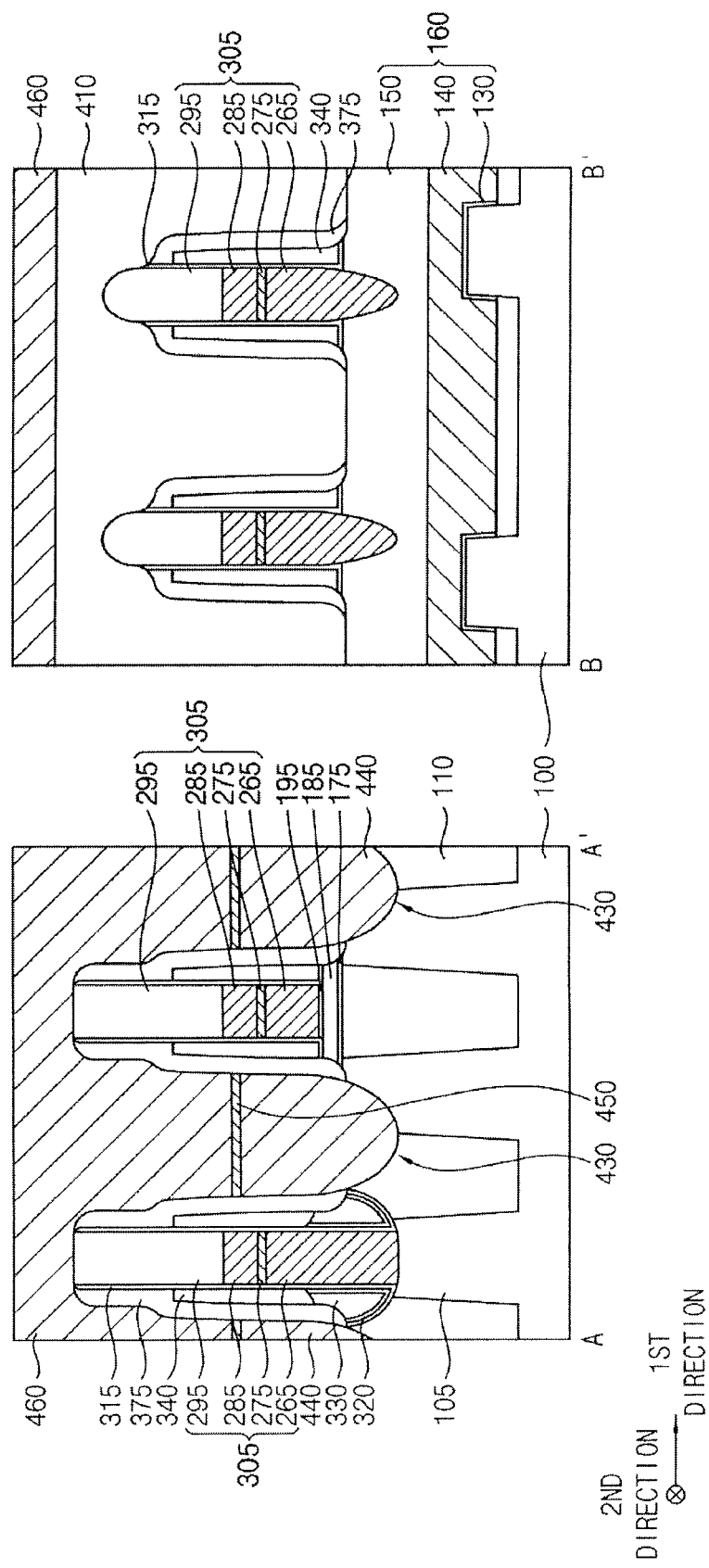

Referring to FIG. 22, a metal silicide pattern 450 may be formed on the lower contact plug 440, and an upper contact layer 460 may be formed on the metal silicide pattern 450, the third spacer 375, and the second and third capping patterns 295 and 410. The metal silicide pattern 450 may be formed by forming a second metal layer on the lower contact plug 440, the third spacer 375, and the second and third capping patterns 295 and 410, performing a heat treatment on the second metal layer, and removing an unreacted portion of the second metal layer. The second metal layer may include, e.g., cobalt, nickel, titanium, etc., and thus the metal silicide pattern 450 may include, e.g., cobalt silicide, nickel silicide, titanium silicide, etc.

As illustrated in FIGS. 18-22, the third spacer layer 370 may be formed to cover the bit line structure 305 and anisotropically etched to form the third spacer 375 covering the, e.g., entire, sidewall of the bit line structure 305, and the lower contact plug 440 may be formed between the third spacers 375, so that no residue, e.g., a nitride of the third spacer 375, may remain on the lower contact plug 440. Particularly, the lower contact plug 440 may be formed by forming the fourth conductive layer and removing an upper portion of the fourth conductive layer, and no additional spacer structure may be formed on the preliminary spacer structure during the formation of the lower contact plug 440.

In a method of manufacturing a semiconductor device in accordance with a comparative embodiment, for example, an upper portion of a fourth conductive layer may be removed, a fourth spacer layer may be formed on the third spacer 375 and the fourth conductive layer, and the fourth spacer and the fourth conductive layer may be removed again, so that a fourth spacer may be further formed on an upper sidewall of the preliminary spacer structure. Accordingly, a width of an upper portion of the comparative preliminary spacer structure including the fourth spacer may be greater than that of a lower portion of the preliminary spacer structure at a height higher than an upper surface of the lower contact plug 440.

However, in example embodiments, the lower contact plug 440 may be formed by a simple process, and thus the metal silicide pattern 450 may be formed well on the lower contact plug 440. Accordingly, a contact resistance between the lower contact plug 440 and the upper contact plug layer 460 may be low. The upper contact plug layer 460 may include a metal, e.g., tungsten, aluminum, copper, etc., and/or doped polysilicon.

Figure 23:
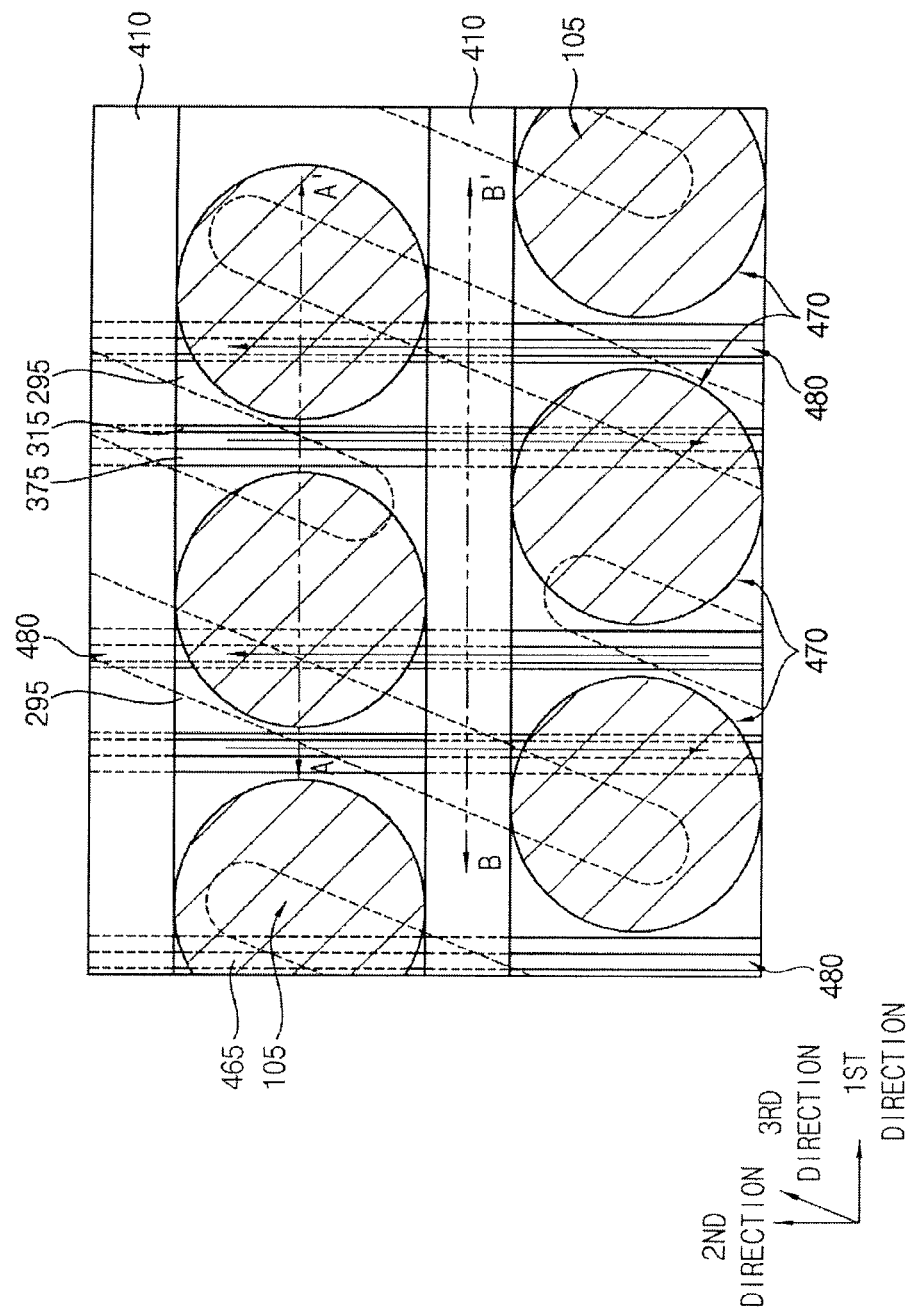
Figure 24:
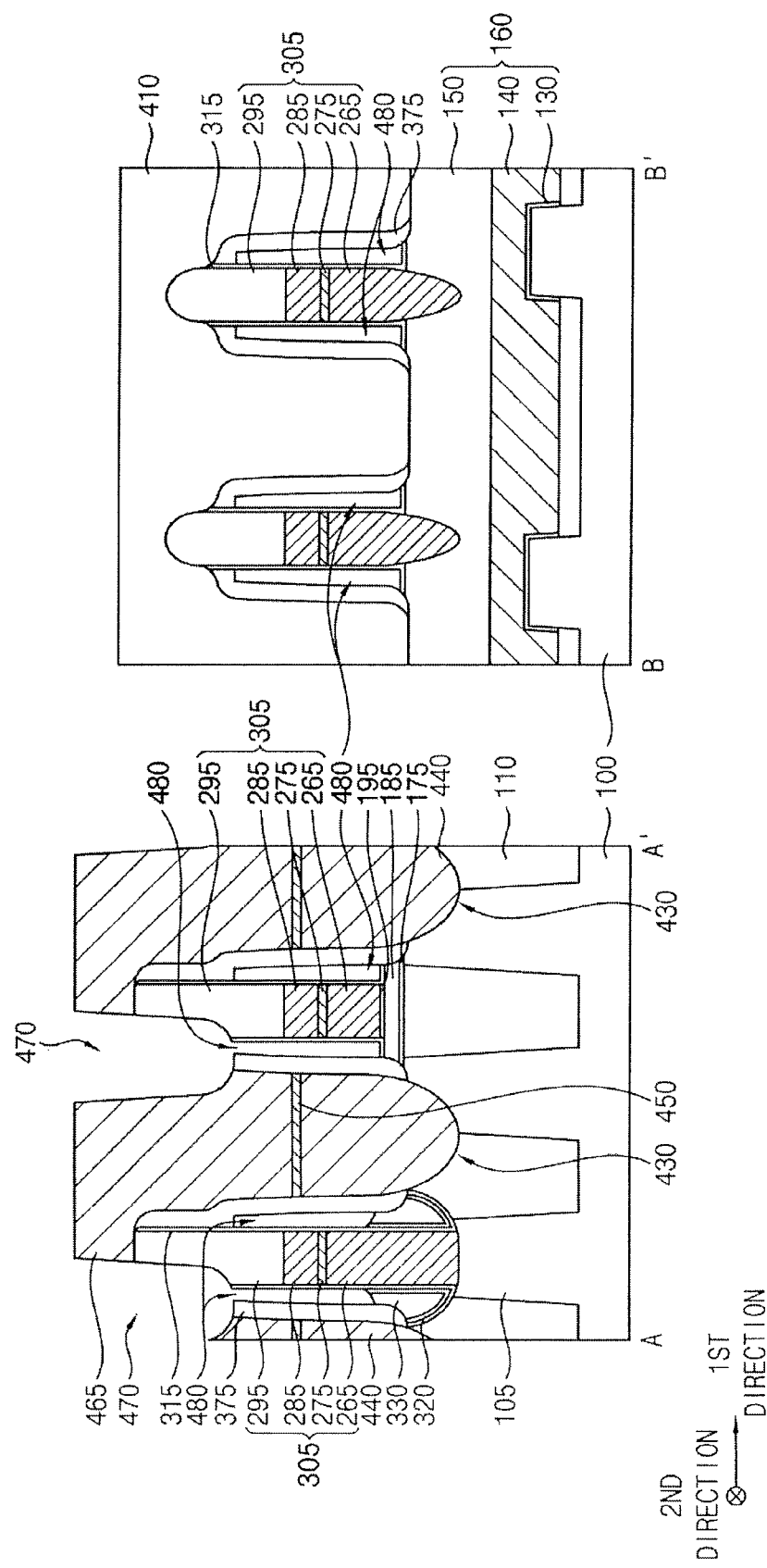

Referring to FIGS. 23 and 24, the upper contact plug layer 460 may be patterned to form an upper contact plug 465 (i.e., hatched circles in FIG. 23). The upper contact plug 465 may be formed by forming a third etching mask on the upper contact plug layer 460, and etching upper portions of the upper contact plug layer 460, the second capping pattern 295, and the first and second spacers 315 and 375 using the third etching mask. A sixth opening 470 may be formed by the etching process to expose an upper surface of the second spacer 340, e.g., the sixth opening 470 may be an opening defined between the upper contact plugs 465 and the third capping pattern 410 (FIG. 23).

In example embodiments, a plurality of upper contact plugs 465 may be formed in each of the first and second directions, and the plurality of upper contact plugs 465 may be arranged in a honeycomb pattern when viewed in a plan view (FIG. 23). In FIG. 23, an upper surface of each of the upper contact plugs 465 does not overlap the third capping pattern 410, however, embodiments are not limited thereto, e.g., the upper surface of each of the upper contact plugs 465 may partially overlap the third capping pattern 410. Each of the upper contact plugs 465 may have a shape of, e.g., a circle, ellipse, polygon, etc., in a plan view.

The lower contact plug 440, the metal silicide pattern 450, and the upper contact plug 465 sequentially stacked may form a contact plug structure. The exposed second spacer 340 may be removed to form a seventh opening 480 connected to the sixth opening 470. The second spacer 340 may be removed by, e.g., a wet etching process.

In example embodiments, in the second spacer 340 on the sidewall of the bit line structure 305 extending in the second direction, not only a portion of the second spacer 340 exposed by the sixth opening 470 but also a portion of the second spacer 340 parallel to the exposed portion may be removed. That is, not only a portion of the second spacer 340 exposed by the sixth opening 470 not to be covered by the upper contact plug 465, but also a portion of the second spacer 340 adjacent thereto in the second direction to be covered by the third capping pattern 410, and a portion of the second spacer 340 adjacent thereto in the second direction to be covered by the upper contact plug 465 may be removed. In other words, the entire second spacer 340 may be removed through the sixth opening 470, such that the seventh opening 480 may extend continuously along an entire length of the sidewall of the bit line structure 305 in the second direction (e.g., the seventh opening 480 is indicated by both solid and dashed lines in FIG. 23).

In detail, as illustrated with reference to FIGS. 14, 17 and 18, an upper surface of the portion of the second spacer 340 not covered by the third capping pattern 410 may have a height substantially equal to that of an upper surface of the portion of the second spacer 340 covered by the third capping pattern 410. Thus, during the removal of the second spacer 340, the upper surface of the portion of the second spacer 340 exposed by the sixth opening 470 may have a height substantially equal to that of the upper surface of the portion of the second spacer 340 covered by the third capping pattern 410, and thus, when the exposed portion of the second spacer 340 is removed during the wet etching process, the portion of the second spacer 340 adjacent to the exposed portion thereof and covered by the third capping pattern 410 may be easily removed. Additionally, when the portion of the second spacer 340 covered by the third capping pattern 410 is removed, the portion of the second spacer 340 adjacent thereto and covered by the upper contact plug 465 may be also easily removed.

Figure 25:
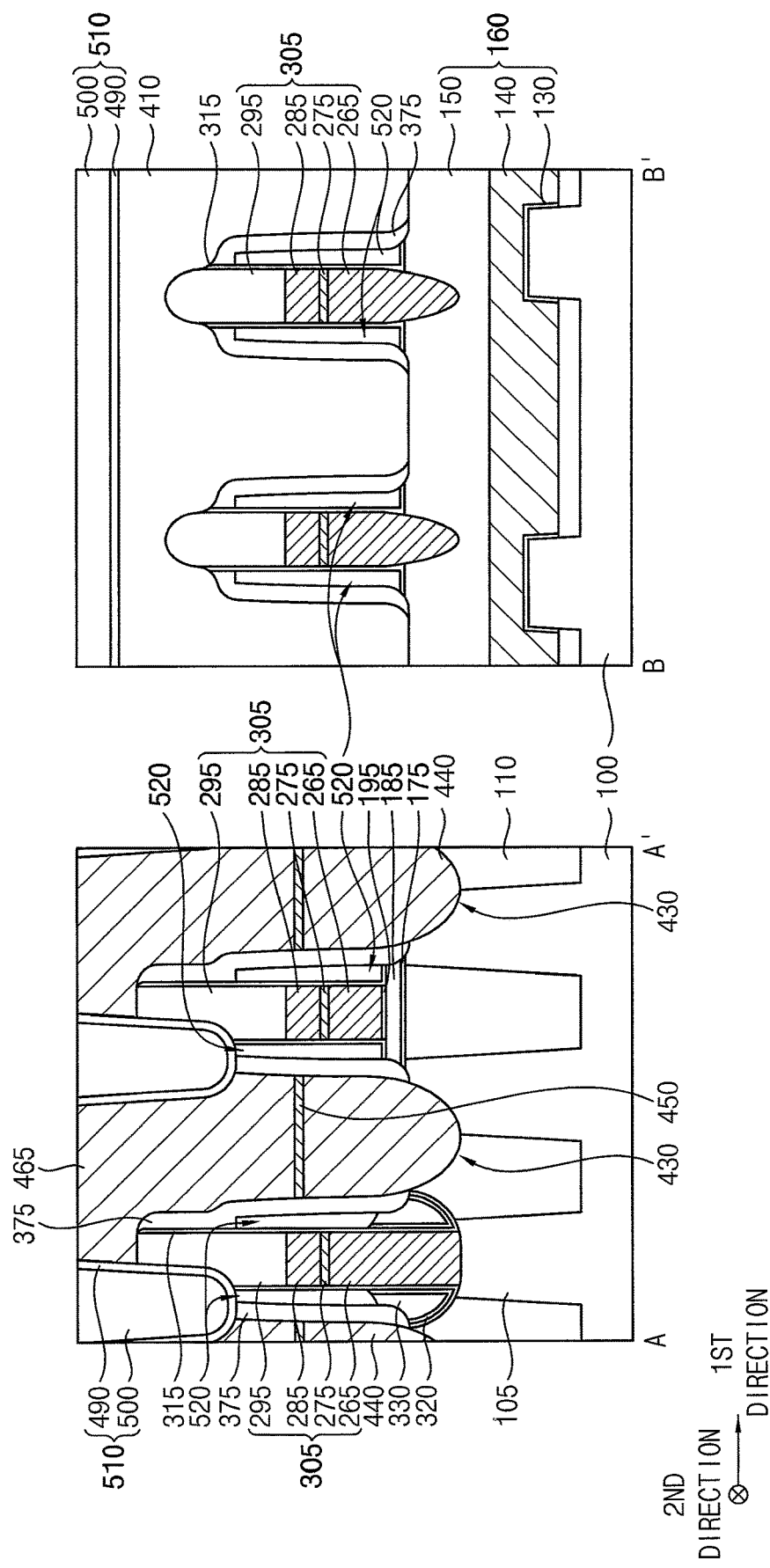

Referring to FIG. 25, an insulating interlayer structure 510 including second and third insulating interlayers 490 and 500 may be formed to fill the sixth opening 470. The insulating interlayer structure 510 may be formed by forming the second insulating interlayer 490 on a bottom of the sixth opening 470, the upper contact plug 465 and the third capping pattern 410, and forming the third insulating interlayer 500 on the second insulating interlayer 490 to fill a remaining portion of the sixth opening 470.

The second insulating interlayer 490 may include a material having poor gap filling characteristics, and thus a lower portion of the seventh opening 480 under the sixth opening 470 may not be filled but remain as an air gap 520. The air gap 520 may be referred to as an air spacer, and may form a spacer structure together with the first and third spacers 340 and 375. That is, the air gap 520 may be a spacer including air. The third insulating interlayer 500 may include an oxide, e.g., silicon oxide.

As described above, not only the portion of the second spacer 340 covered by the third capping pattern 410 but also the portion of the second spacer 340 covered by the upper contact plug 465 may be easily removed, and thus the air gap 520 may be formed on the sidewall of the bit line structure 305. In other words, the air gap 520 may be formed under the insulating interlayer structure 510 (i.e., during formation of the second insulating interlayer 490 in the sixth opening 470), and may be defined under the third capping pattern 410 and under the upper contact plug 465 (i.e., during formation of the seventh opening 480 via removal of the entire second spacer 340). As such, the air gap 520 may be formed along an entire length of the sidewall of the bit line structure 305 in the second direction. Accordingly, the parasitic capacitance between the bit line structure 305 and the upper contact plug 465 and/or the lower contact plug 440 may be effectively reduced.

Figure 26:
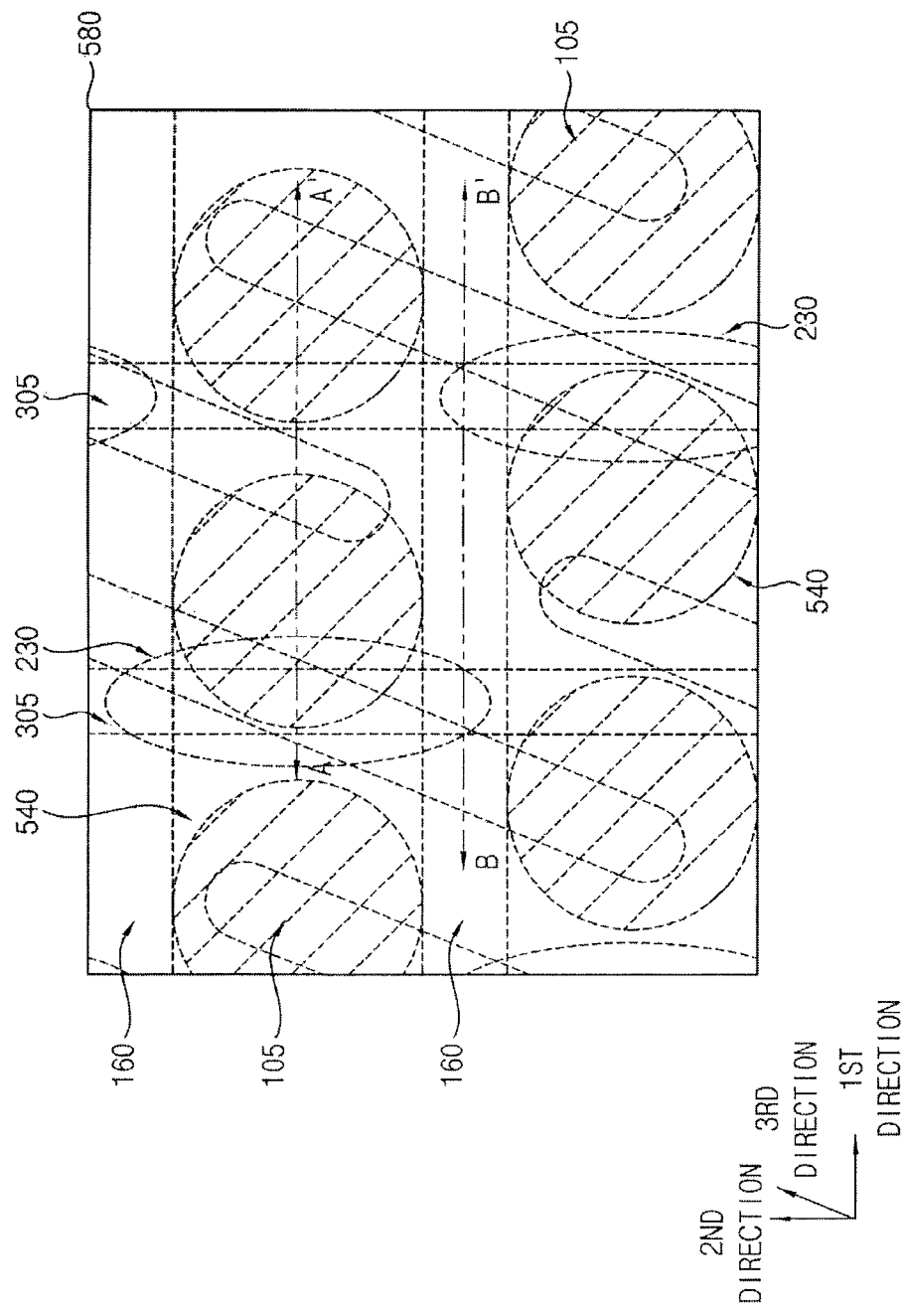
Figure 27:
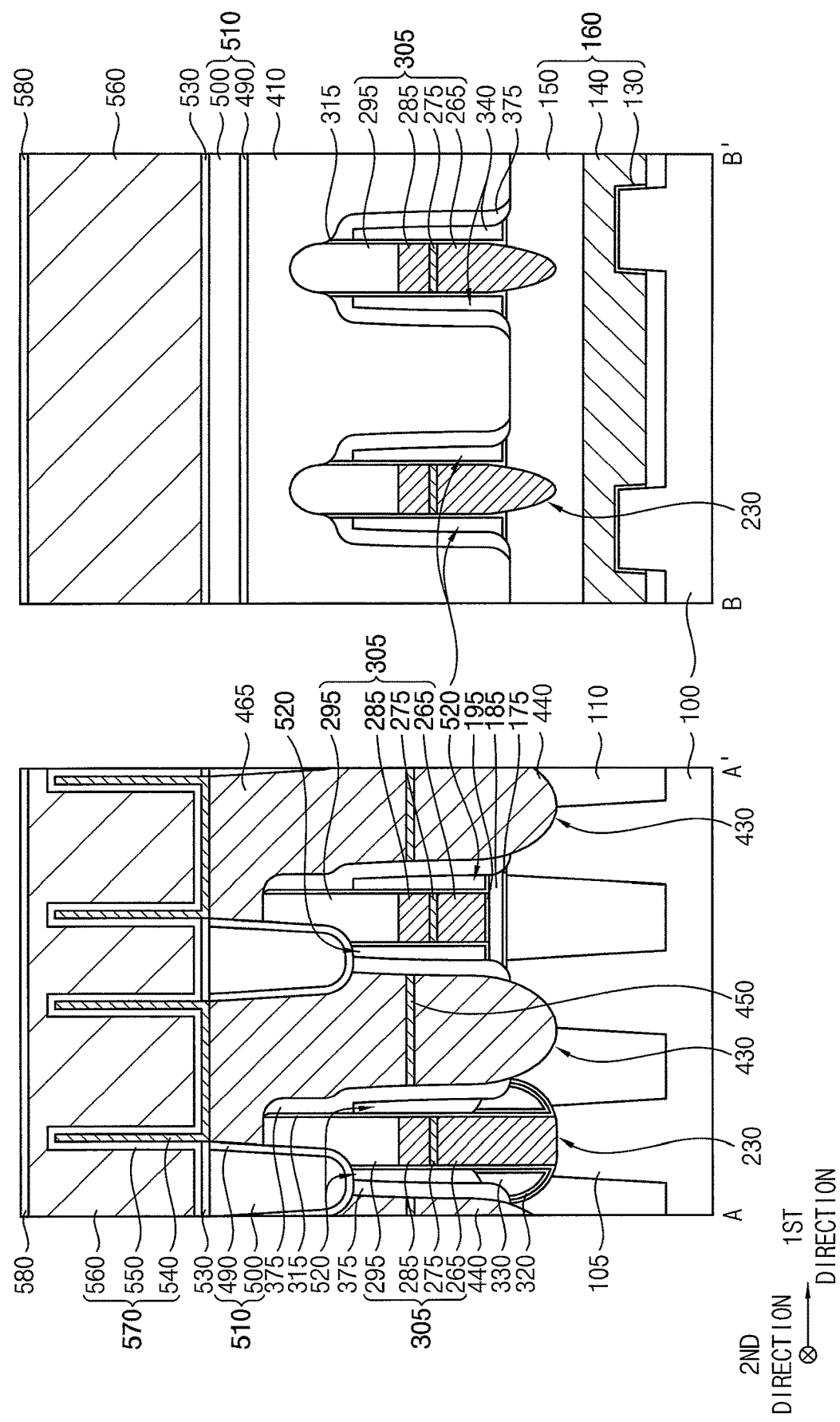

Referring to FIGS. 26 and 27, a capacitor 560 may be formed to contact an upper surface of the upper contact plug 465. That is, an etch stop layer 520 and a mold layer may be sequentially formed on the upper contact plug 465 and the insulating interlayer structure 510, and partially etched to form an eighth opening exposing the upper surface of the upper contact plug 465.

A lower electrode layer may be formed on a sidewall of the eighth opening, the exposed upper surface of the upper contact plug 465 and the mold layer, a second sacrificial layer may be formed on the lower electrode layer to sufficiently fill a remaining portion of the eighth opening, and upper portions of the lower electrode layer and the second sacrificial layer may be planarized until an upper surface of the mold layer may be exposed to divide the lower electrode layer. The remaining second sacrificial layer and the mold layer may be removed by, e.g., a wet etching process, and thus a cylindrical lower electrode 530 may be formed on the exposed upper surface of the upper contact plug 465. Alternatively, a pillar-type lower electrode 530 filling the eighth opening may be formed.

A dielectric layer 540 may be formed on the lower electrode 530 and the etch stop layer 520, and an upper electrode 550 may be formed on the dielectric layer 540 to form a capacitor 560 including the lower electrode 530, the dielectric layer 540 and the upper electrode 550.

In example embodiments, the lower electrode 530 and the upper electrode 550 may include substantially the same material, e.g., doped polysilicon or a metal. The dielectric layer 540 may include an oxide, e.g., silicon oxide, metal oxide, etc., and/or a nitride, e.g., silicon nitride, metal nitride, etc. The metal of the dielectric layer 540 may include, e.g., aluminum, zirconium, titanium, hafnium, etc. A fourth insulating interlayer 580 may be formed to cover the capacitor 560, which may complete the semiconductor device.

As described above, in the method of manufacturing the semiconductor device, before forming the third opening 400 for the third capping pattern 410, the upper portion of the second spacer 340 may be removed and the third spacer layer 370 may be formed to cover the second spacer 340. Thus, when the third opening 400 is formed, even if the second capping pattern 295 and the third spacer layer 370 are partially removed, the second spacer 340 may not be exposed, and thus the second spacer 340 may have a constant height regardless of portions thereof.

Accordingly, when the seventh opening 480 for forming the air spacer 520 is formed by removing the second spacer 340, the portion of the second spacer 340 not exposed by the sixth opening 470, i.e., the portion of the second spacer 340 covered by the third capping pattern 410, may be easily removed as well, and further, the portion of the second spacer 340 covered by the upper contact plug 465 may be also easily removed as well. That is, the portion of the second spacer 340 covered by the third capping pattern 410 is removed so as to serve as a path for removing the portion of the second spacer 340 covered by the upper contact plug 465. As a result, the air spacer 520 may be formed on the entire sidewall of the bit line structure 305 extending in the second direction, e.g., to replace the removed second spacer 340, and thus the parasitic capacitance between the bit line structure 305 and the contact plug structure may be effectively reduced.

After forming the third spacer 375 to expose the active pattern 105, the lower contact plug 440 may be formed on the exposed active pattern 105, and the metal silicide pattern 450 may be directly formed on the lower contact plug 440. Thus, no residue including, e.g., a nitride may remain on the lower contact plug 440, so that the contact resistance between the lower contact plug 440 and the upper contact plug 465 may be effectively reduced by the metal silicide pattern 450.

The semiconductor device in accordance with example embodiments may include the bit line structure 305, the spacer structure, and the contact plug structure.

The bit line structure 305 may extend in a vertical direction substantially perpendicular to the upper surface of the substrate 100, and may include the conductive pattern structure 265, the barrier pattern 275, the metal pattern 285, and the second capping pattern 295 sequentially stacked in the vertical direction. In example embodiments, the bit line structure 305 may extend in the second direction.

The spacer structure may be formed on each of opposite sidewalls of the bit line structure 305, and thus may extend in the second direction. The spacer structure may include the first spacer 315, the air spacer 520, and the third spacer 375 sequentially stacked in the first direction on each of opposite sidewalls of the bit line structure 305.

The first spacer 315 may directly contact the sidewall of the bit line structure 305, the air spacer 520 may directly contact a portion of an outer sidewall of the first spacer 315, and the third spacer 375 may directly contact an upper portion of the first spacer 315 and cover an outer sidewall and an upper surface of the air spacer 520. In example embodiments, the upper surface of the air spacer 520 may be lower than those of the first and third spacers 315 and 375, and may be covered by the third spacer 375. In example embodiments, the upper surface of the air spacer 520 may have a constant height along the second direction.

The contact plug structure may extend in the vertical direction, and may include the lower contact plug 440, the metal silicide pattern 450, and the upper contact plug 465 sequentially stacked in the vertical direction. In an example embodiment, the metal silicide pattern 450 may be disposed at a height between a bottom and a top of the metal pattern 285. In example embodiments, the contact plug structure may directly contact an outer sidewall of the third spacer 375 at a height between a bottom and a top of the air spacer 520.

The isolation pattern 110 may be formed on the substrate 100, and thus the active pattern 105 surrounded by the isolation pattern 110 may be defined. The semiconductor device may further include the gate structure 160 extending in the first direction on the active pattern 105 and the isolation pattern 110, and the bit line structure 305 may extend in the second direction on the active pattern 105, the isolation pattern 110 and the gate structure 160. In example embodiments, a plurality of active patterns 105 may be formed in each of the first and second directions, and a plurality of gate structures 160 may be formed in the second direction, and a plurality of bit line structures 305 may be formed in the first direction.

The recess 230 may be formed on the active pattern 105, the isolation pattern 110 and the gate structure 160, and the first spacer 315 may cover a sidewall of a portion of the bit line structure 305 in the recess 230 and a bottom of the recess 230. The fourth insulation pattern 320 may be formed on the portion of the first spacer 315 in the recess 230, and the fifth insulation pattern 330 filling a remaining portion of the recess 230 may be formed on the fourth insulation pattern 320. In example embodiments, the air spacer 520 and the third spacer 375 may contact upper surfaces of the fourth and fifth insulation patterns 320 and 330, respectively.

The insulation pattern structure may include the first to third insulation patterns 175, 185 and 195 sequentially stacked on portions of the active pattern 105 and the isolation pattern 110 not having the recess 230 thereon and between the bit line structures 305. The second insulation pattern 185 may contact a bottom of the first spacer 315 having a cross-section of an "L" shape, and the third insulation pattern 195 may contact a bottom of the bit line structure 305.

In example embodiments, a portion of the bit line structure 305 on the gate structure 160 in the recess 230 may have a width gradually decreasing from a top toward a bottom thereof.

The semiconductor device may extend in the first direction on the gate structure 160, and may further include the third capping pattern 410 covering the bit line structure 305 and the spacer structure.

In example embodiments, a height of the top surface of the portion of the bit line structure 305 covered by the third capping pattern 410 may be lower than that of the top surface of the portion of the bit line structure 305 not covered by the third capping pattern 410. In example embodiments, an upper surface of the portion of the air spacer 520 overlapping the third capping pattern 410 in the vertical direction may be substantially coplanar with an upper surface of the portion of the air spacer 520 overlapping the contact plug structure in the vertical direction.

The semiconductor device may extend through the upper portion of the bit line structure 305 and the contact plug structure, and may further include the insulating interlayer 510 contacting the upper surface of the air spacer 520 and the capacitor 560 contacting the upper surface of the contact plug structure.

By way of summation and review, example embodiments provide a semiconductor device having good characteristics. That is, in the method of manufacturing the semiconductor device in accordance with example embodiments, an air spacer may be formed on the entire sidewall of the bit line structure, and thus the parasitic capacitance between the bit line structure and the contact plug structure may be reduced. No residue may remain on the lower contact plug, and thus the metal silicide pattern may be well formed thereon. Accordingly, the contact resistance between the lower contact plug and the upper contact plug may be effectively reduced due to the metal silicide pattern.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
   a bit line structure on a substrate;
   a spacer structure including:
      a first spacer directly contacting a sidewall of the bit line structure,
      an air spacer directly contacting a portion of an outer sidewall of the first spacer, the air spacer including air, and
      a third spacer directly contacting an upper portion of the first spacer and an upper portion of the air spacer, the third spacer extending along the sidewall of the bit line structure toward the substrate, and the air spacer being enclosed between the first and third spacers;
   a contact plug structure extending in a vertical direction substantially perpendicular to an upper surface of the substrate and directly contacting an outer sidewall of the third spacer;
   an active pattern defined by an isolation pattern on the substrate;
   a gate structure extending in a first direction substantially parallel to the upper surface of the substrate on the active pattern and the isolation pattern; and
   an opening in the active pattern, the isolation pattern, and the gate structure, the first spacer covering a sidewall of a portion of the bit line structure in the opening and a bottom of the opening,
   wherein the bit line structure extends in a second direction substantially parallel to the upper surface of the substrate and crosses the first direction on the active pattern, the isolation pattern, and the gate structure.

2. The semiconductor device as claimed in claim 1, further comprising:
   a first insulation pattern on a portion of the first spacer in the opening; and
   a second insulation pattern on the first insulation pattern in the opening.

3. The semiconductor device as claimed in claim 2, wherein each of the air spacer and the third spacer contacts upper surfaces of the first and second insulation patterns.

4. The semiconductor device as claimed in claim 2, wherein the first and third spacers include a nitride.

5. The semiconductor device as claimed in claim 1, further comprising an insulation pattern structure between the bit line structure and portions of the active pattern and the isolation pattern having no opening thereon.

6. The semiconductor device as claimed in claim 5, wherein:
   the insulation pattern structure includes third, fourth, and fifth insulation patterns sequentially stacked, and
   the fourth insulation pattern contacts a bottom of the first spacer, and the fifth insulation pattern contacts a bottom of the bit line structure.

7. The semiconductor device as claimed in claim 6, wherein the third, fourth, and fifth insulation patterns include an oxide, a nitride, and an oxide, respectively.

8. The semiconductor device as claimed in claim 1, wherein a portion of the bit line structure on the gate structure in the opening has a width gradually decreasing from a top toward a bottom thereof.

9. The semiconductor device as claimed in claim 1, further comprising a first capping pattern extending in the first direction on the gate structure and covering the bit line structure and the spacer structure.

10. The semiconductor device as claimed in claim 1, wherein an upper surface of the air spacer has a constant height along the second direction.

11. The semiconductor device as claimed in claim 1, wherein:
the bit line structure includes a conductive pattern, a barrier pattern, a metal pattern, and a second capping pattern sequentially stacked,
the contact plug structure includes a lower contact plug, a metal silicide pattern, and an upper contact plug sequentially stacked, and
the metal silicide pattern is at a height between respective heights of a bottom and a top of the metal pattern.

12. The semiconductor device as claimed in claim 11, wherein the spacer structure does not include a portion having a width gradually increasing from a bottom toward a top thereof at a height higher than a height of an upper surface of the metal silicide pattern.

13. A semiconductor device, comprising:
a bit line structure on a substrate, the bit line structure extending in a first direction substantially parallel to an upper surface of the substrate;
a spacer structure including a first spacer, an air spacer, and a third spacer sequentially stacked on each of opposite sidewalls of the bit line structure in a second direction substantially parallel to the upper surface of the substrate and substantially perpendicular to the first direction, the first spacer, the air spacer, and the third spacer including a nitride, air, and a nitride, respectively;
a capping pattern extending on the substrate in the second direction and covering the bit line structure and the spacer structure; and
a contact plug structure adjacent the capping pattern in the first direction, the contact plug structure extending in a vertical direction substantially perpendicular to the upper surface of the substrate and contacting an outer sidewall of the spacer structure and a portion of an upper surface of the bit line structure,
wherein the air spacer includes a first portion overlapping the contact plug structure in the vertical direction and a second portion overlapping the capping pattern in the vertical direction, the first and second portions of the air spacer being adjacent to each other along the first direction to overlap different parts of the bit line structure along the second direction, and upper surfaces of the first and second portions of the air spacer are substantially coplanar with each other.

14. The semiconductor device as claimed in claim 13, wherein an upper surface of the air spacer is lower than upper surfaces of the first and third spacers, and covered by the third spacer.

15. The semiconductor device as claimed in claim 13, further comprising an insulating interlayer structure extending through upper portions of the bit line structure and the contact plug structure and contacting an upper surface of the air spacer.

16. The semiconductor device as claimed in claim 13, further comprising:
an active pattern defined by an isolation pattern on the substrate; and
a gate structure in the second direction on the active pattern and the isolation pattern,
wherein the capping pattern extends in the second direction on the gate structure, and
wherein the bit line structure extends in the first direction on the active pattern, the isolation pattern, and the gate structure.

17. A semiconductor device, comprising:
a bit line structure on a substrate, the bit line structure extending in a first direction substantially parallel to an upper surface of the substrate;
a spacer structure including a first spacer, an air spacer, and a third spacer sequentially stacked on each of opposite sidewalls of the bit line structure in a second direction substantially parallel to the upper surface of the substrate and substantially perpendicular to the first direction, the first spacer, the air spacer, and the third spacer including a nitride, air, and a nitride, respectively;
a capping pattern extending on the substrate in the second direction and covering tops of the bit line structure and the spacer structure; and
a contact plug structure adjacent the capping pattern, the contact plug structure extending in a vertical direction substantially perpendicular to the upper surface of the substrate and contacting an outer sidewall of the spacer structure,
wherein an upper surface of the air spacer is lower than upper surfaces of the first and third spacers, and covered by the third spacer,
wherein the bit line structure includes first and second portions adjacent to each other along the first direction, the first portion of the bit line structure having a top surface covered by the capping pattern, the second portion of the bit line structure having a top surface not covered by the capping pattern, and a height of the top surface of the first portion of the bit line structure being lower than a height of the top surface of the second portion of the bit line structure,
wherein the bit line structure includes a conductive pattern, a barrier pattern, a metal pattern, and a second capping pattern sequentially stacked,
wherein the contact plug structure includes a lower contact plug, a metal silicide pattern, and an upper contact plug sequentially stacked, and
wherein the metal silicide pattern is at a height between respective heights of a bottom and a top of the metal pattern.

* * * * *